United States Patent
Amey, Jr. et al.

(10) Patent No.: US 7,613,007 B2
(45) Date of Patent: Nov. 3, 2009

(54) POWER CORE DEVICES

(75) Inventors: Daniel Irwin Amey, Jr., Durham, NC (US); Sounak Banerji, Cary, NC (US); William J. Borland, Cary, NC (US); Karl Hartmann Dietz, Raleigh, NC (US); David Ross McGregor, Apex, NC (US); Attiganal N. Sreeram, Raleigh, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 279 days.

(21) Appl. No.: 11/289,994

(22) Filed: Nov. 30, 2005

(65) Prior Publication Data

US 2006/0138591 A1  Jun. 29, 2006

Related U.S. Application Data

(60) Provisional application No. 60/637,813, filed on Dec. 21, 2004.

(51) Int. Cl.
*H05K 1/18* (2006.01)

(52) U.S. Cl. .................. 361/763; 361/760; 361/761; 361/766; 361/782

(58) Field of Classification Search .............. 257/532, 257/691, 700; 361/760, 763, 761, 782, 738, 361/748–751, 780, 783, 790–795, 811, 821, 361/299.1, 299.2, 299.3, 301.1, 766
See application file for complete search history.

(56) References Cited

U.S. PATENT DOCUMENTS

| | | | |
|---|---|---|---|
| 5,010,641 A | 4/1991 | Sisler | |
| 5,079,069 A | 1/1992 | Howard et al. | |
| 5,155,655 A | 10/1992 | Howard et al. | |
| 5,161,086 A | 11/1992 | Howard et al. | |
| 5,162,977 A | 11/1992 | Paurus et al. | |
| 5,428,499 A | 6/1995 | Szerlip et al. | |
| 5,469,324 A | 11/1995 | Henderson et al. | |
| 5,870,274 A | 2/1999 | Lucas | |
| 6,214,445 B1* | 4/2001 | Kanbe et al. | 428/209 |
| 6,346,743 B1 | 2/2002 | Figueroa et al. | |
| 6,407,929 B1 | 6/2002 | Hale et al. | |
| 6,532,143 B2* | 3/2003 | Figueroa et al. | 361/301.4 |
| 6,611,419 B1* | 8/2003 | Chakravorty | 361/306.3 |
| 6,661,642 B2 | 12/2003 | Allen et al. | |
| 7,215,531 B2* | 5/2007 | Naito et al. | 361/306.1 |
| 2002/0054471 A1 | 5/2002 | Adae-Amoakoh et al. | |
| 2002/0134581 A1* | 9/2002 | Figueroa et al. | 174/260 |
| 2004/0233611 A1 | 11/2004 | Borland | |
| 2006/0133011 A1 | 6/2006 | Cox | |
| 2006/0133057 A1 | 6/2006 | McGregor et al. | |
| 2006/0158828 A1 | 7/2006 | Amey, Jr. et al. | |
| 2006/0180342 A1* | 8/2006 | Takaya et al. | 174/260 |
| 2007/0006435 A1 | 1/2007 | Banerji et al. | |
| 2007/0090511 A1 | 4/2007 | Borland et al. | |

* cited by examiner

*Primary Examiner*—Dean A. Reichard
*Assistant Examiner*—Hoa C Nguyen

(57) ABSTRACT

The present invention relates to a device comprising a power core wherein said power core comprises: at least one embedded singulated capacitor layer containing at least one embedded singulated capacitor; and at least one planar capacitor laminate; wherein said planar capacitor laminate serves as a low inductance path to supply a charge to said at least one embedded singulated capacitor; and wherein said at least one embedded singulated capacitor is connected in parallel to at least one of the said planar capacitor laminates; and wherein said power core is interconnected to at least one signal layer.

14 Claims, 20 Drawing Sheets

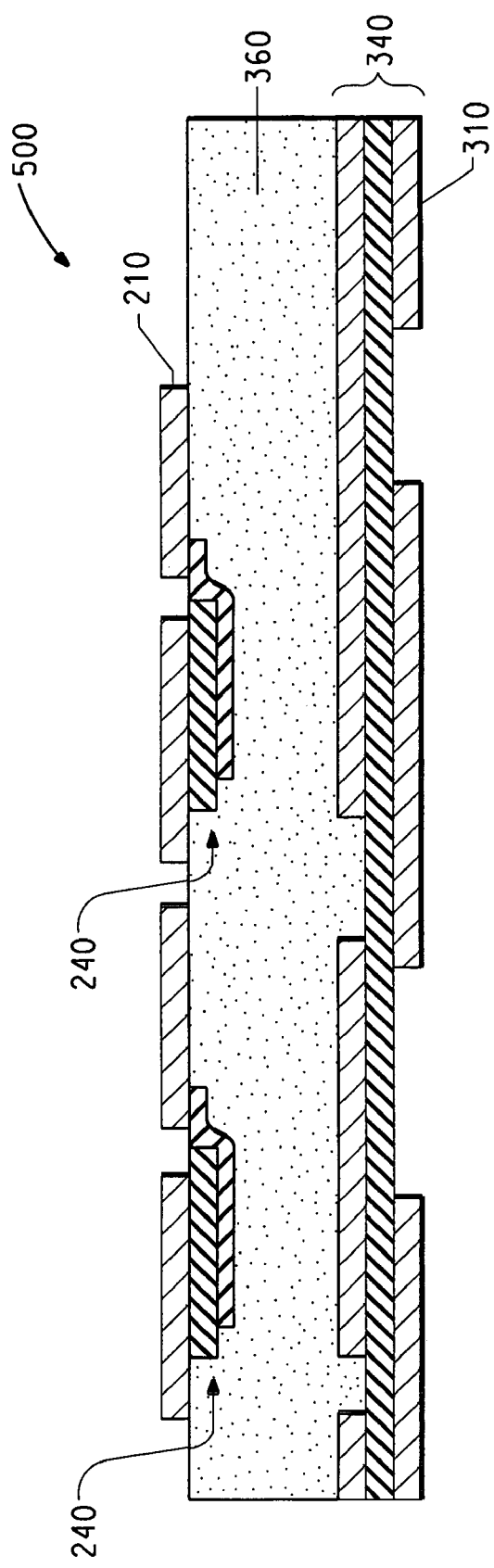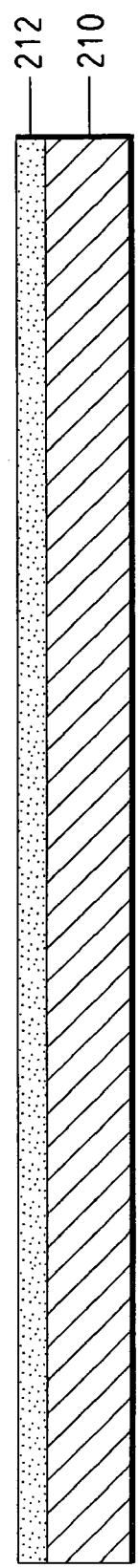
FIG. 3
FIG. 4A

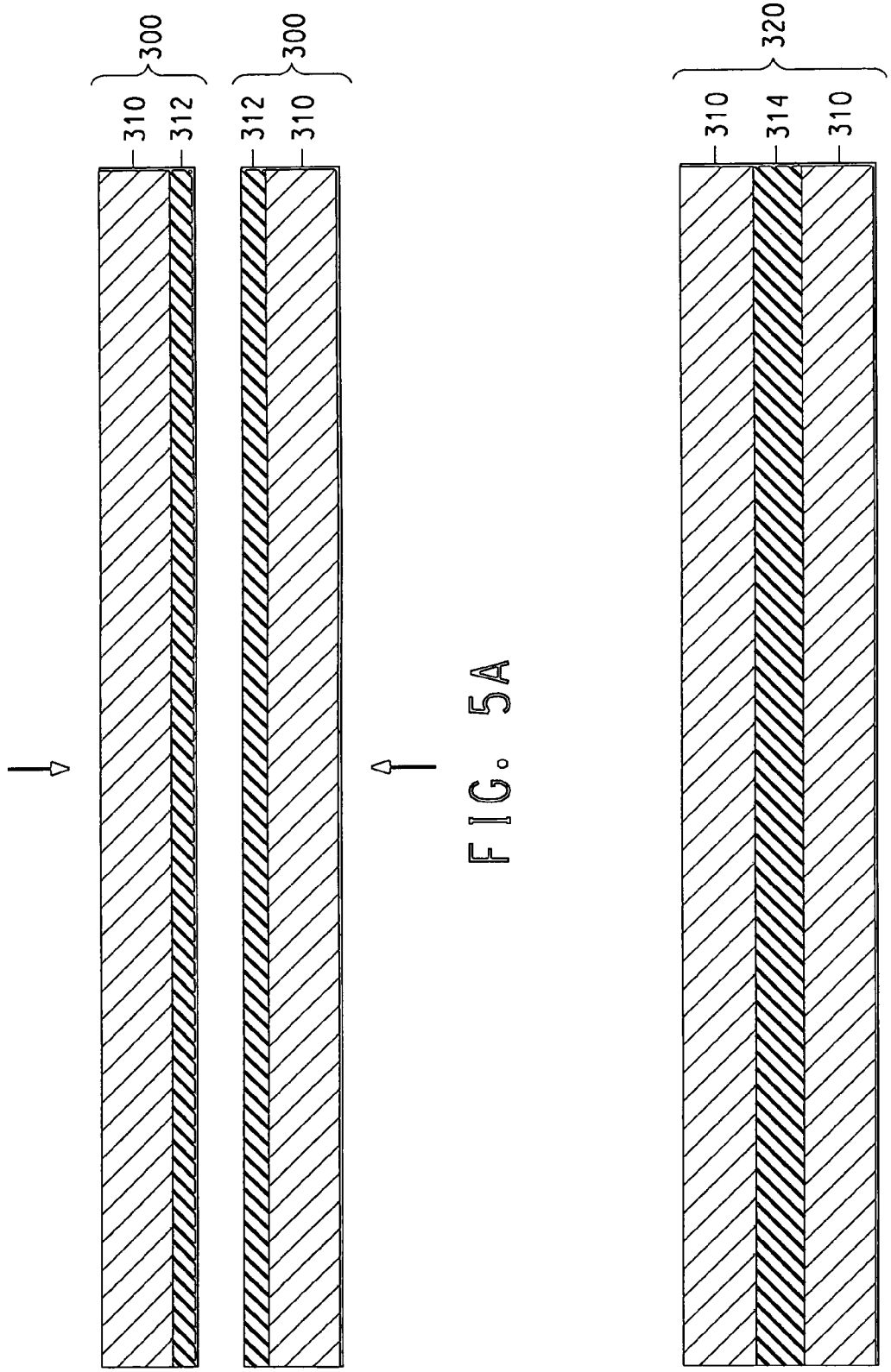

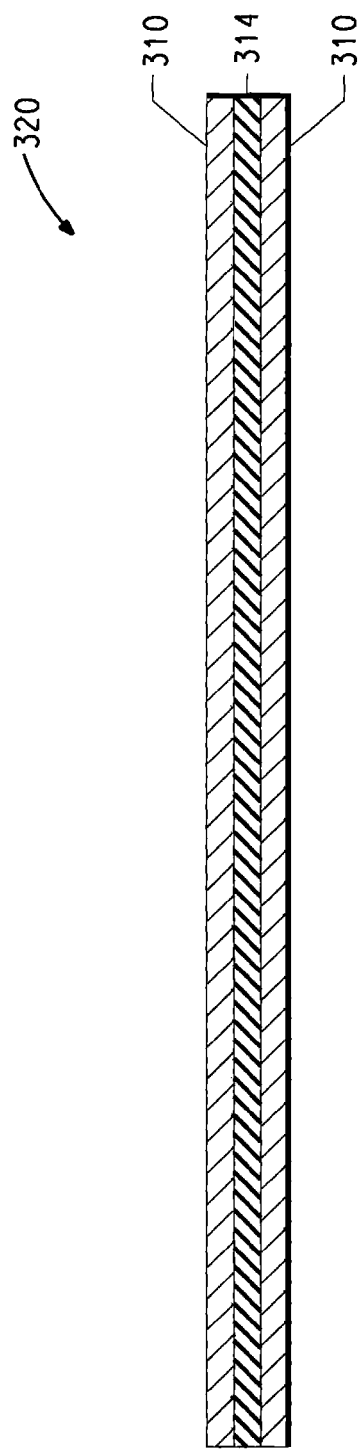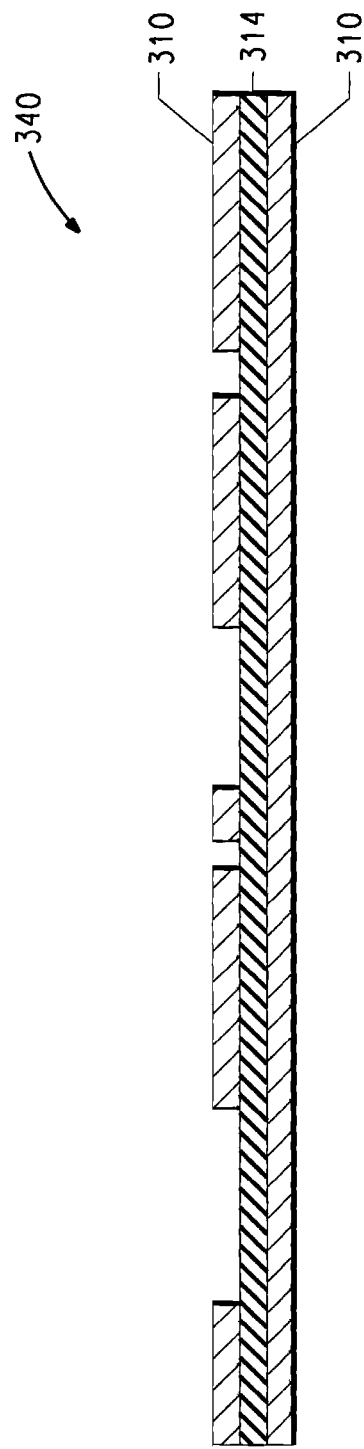

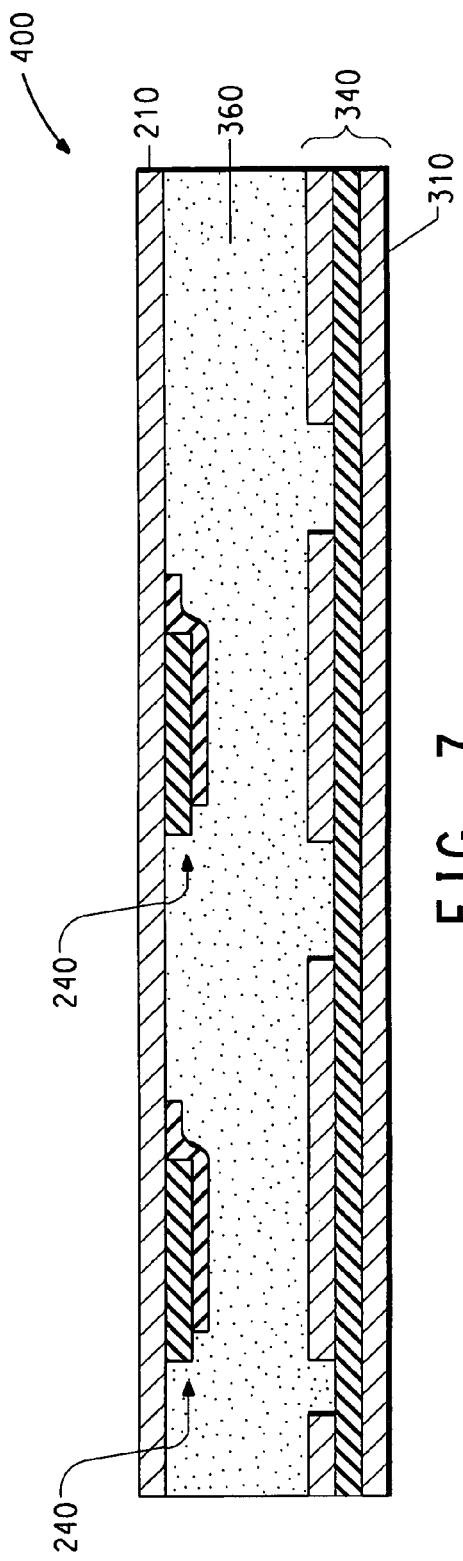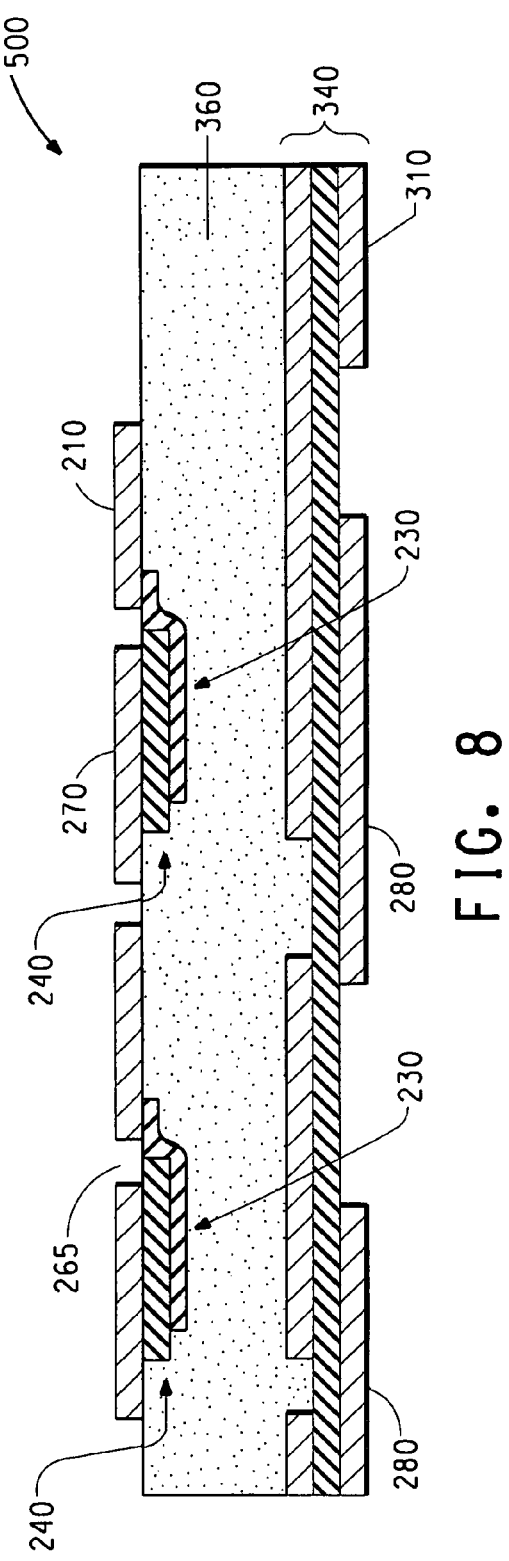

S = signal
P = power
G = ground

POWER CORE DEVICES

FIELD OF THE INVENTION

The technical field relates to devices having both low inductance and high capacitance functions, and methods of incorporating such devices in power core packages, including organic dielectric laminates and printed wiring boards.

BACKGROUND OF THE INVENTION

As semiconductor devices including integrated circuits (IC) operate at higher frequencies, higher data rates and lower voltages, noise in the power and ground (return) lines and supplying sufficient current to accommodate faster circuit switching becomes an increasingly important problem requiring low impedance in the power distribution system. In order to provide low noise, stable power to the IC, impedance in conventional circuits is reduced by the use of additional surface mount capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will malfunction. Additionally, as the IC powers up, a slow response time will result in power overshoot. Power droop and overshoot must be controlled within allowable limits by the use of capacitors that are close enough to the IC that they provide or absorb power within the appropriate response time.

Capacitors for impedance reduction and dampening power droop or overshoot are generally placed as close to the IC as possible to improve circuit performance. Conventional designs have capacitors surface mounted on a printed wiring board (PWB) clustered around the IC. Large value capacitors are placed near the power supply, mid-range value capacitors at locations between the IC and the power supply and small value capacitors very near the IC. FIG. 1 is a schematic illustration of a power supply, an IC and the capacitors 4, 6, 8, which represent high value, mid-range value and small value capacitors, respectively, used for impedance reduction and dampening power droop or overshoot as described above. FIG. 2 is a representative section view in front elevation showing the connections of the SMT capacitors 50 and 60 and IC 40 to the power and ground planes in the substrate of the PWB. IC device 40 is connected to lands 41 by solder filets 44. Lands 41 are connected to plated-through hole via (via) pads of vias 90 and 100 by circuit lines 72 and 73. Via pads are shown generically as 82. Via 90 is electrically connected to conductor plane 120 and via 100 is connected to conductor plane 122. Conductor planes 120 and 122 are connected one to the power side of the power supply and the other to the ground side of the power supply. Small value capacitors 50 and 60 are similarly electrically connected to vias and conductor planes 120 and 122 in such a way that they are electrically connected to IC 40 in parallel. In the case of ICs placed on modules, interposers, or packages, the large and medium value capacitors may reside on the printed wiring mother board to which the modules, interposers, or packages are attached.

Large numbers of capacitors, interconnected in parallel, are often required to reduce power system impedance requiring complex electrical routing. This leads to increased circuit loop inductance, which in turn increases impedance, constraining current flow, thereby reducing the beneficial effects of the surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard, et al., provides one approach to minimizing impedance and "noise". Howard, et al., provides a capacitive printed circuit board with a capacitor laminate (planar capacitor) included within the multiple layers of the laminated board, a large number of devices such as integrated circuits being mounted or formed on the board and operatively coupled with the capacitor laminate (or multiple capacitor laminates) to provide a capacitive function employing borrowed or shared capacitance. However, such an approach does not necessarily improve voltage response. Improved voltage response requires that the capacitor is placed closer to the IC. Simply placing the capacitor laminate closer to the IC may not be sufficient because the total capacitance available may be insufficient.

U.S. Pat. No. 6,611,419 to Chakravorty provides for an alternate approach to embedding capacitors to reduce switching noise wherein the power supply terminals of an integrated circuit die can be coupled to the respective terminals of at least one embedded capacitor in a multilayer ceramic substrate.

Accordingly, the present inventors desired to provide a method of making and design of a power core for use in power core packages, which include use in integrated circuit packages or other interconnecting boards, structures, or elements, that allows for superior power distribution impedance reduction combined with improved voltage response to accommodate higher IC switching speeds. The present invention provides such a device and method of making such a device.

SUMMARY

The present invention is directed to a device comprising a power core wherein the power core comprises: at least one embedded singulated capacitor layer containing at least one embedded singulated capacitor; and at least one planar capacitor laminate; wherein said planar capacitor laminate serves as a low inductance path to supply a charge to said at least one embedded singulated capacitor; and wherein said at least one embedded singulated capacitor is connected in parallel to at least one of the said planar capacitor laminates; and wherein said power core is interconnected to at least one signal layer.

The present invention is further directed to a method for making a device comprising: providing at least one planar capacitor having a patterned side and a non-patterned side; providing at least one foil structure comprising at least one formed on foil singulated capacitor having a foil side and a component side; and laminating said component side of said foil structure to said patterned side of said planar capacitor structure; etching said foil side of said foil structure and etching said non-patterned side of said planar capacitor structure forming a power core; and forming at least one signal layer onto said power core.

A further embodiment is directed to a method for making a device comprising: providing at least one planar capacitor having a patterned side and a non-patterned side; providing at least one foil structure comprising at least one formed on foil singulated capacitor having a foil side and a component side; and laminating said foil side of said foil structure to said patterned side of said planar capacitor structure etching said foil side of said foil structure and etching said non-patterned side of said planar capacitor structure forming a power core; and forming at least one signal layer onto said power core.

BRIEF DESCRIPTION OF THE DRAWINGS

The detailed description will refer to the following drawings, wherein like numerals refer to like elements, and wherein:

FIG. 3 is a representation in section view in front elevation of a power core device according to a first embodiment.

FIGS. 4A-4F illustrate a method of making singulated thick-film fired-on-foil capacitors.

FIGS. 5A-5B illustrate a method of making a planar capacitor laminate.

FIGS. 6A-6B illustrate initial preparation of a planar capacitor laminate for manufacture of the power core device according to a first embodiment.

FIG. 7 is a representation in section view in front elevation of a power core structure subpart according to a first embodiment.

FIG. 8 is a representation in section view in front elevation of a power core structure according to a first embodiment.

FIG. 9 is a representation in section view in front elevation of a power core structure wherein an additional prepreg layer and metallic layer have been laminated to the core. Additionally, drilled, plated through hole vias have been formed.

FIG. 10 is a representation in section view in front elevation of a power core structure wherein "build-up" layers of dielectric film have been laminated to the core.

FIG. 11 is a representation in section view in front elevation of a power core structure wherein combined "build-up" layers of dielectric film have been applied to the core.

FIG. 12 is a representation in section view in front elevation of a power core structure with additional "build-up" layers that contain metallized microvia (blind via) connections and circuits on the surface of the build-up layer.

FIG. 13 is a representation in section view in front elevation of a power core structure comprising patterned conductors on the surface of the build-up layer.

FIG. 14 is a representation in section view in front elevation of a power core structure comprising patterned conductors on the surface of the build-up layer and subsequent build-up layers which have been formed, metallized, and patterned in a similar fashion.

FIG. 15 is a representation in section view in front elevation of a power core structure wherein singulated capacitors have also be incorporated into the build-up dielectric layer.

DETAILED DESCRIPTION

Figure 1:
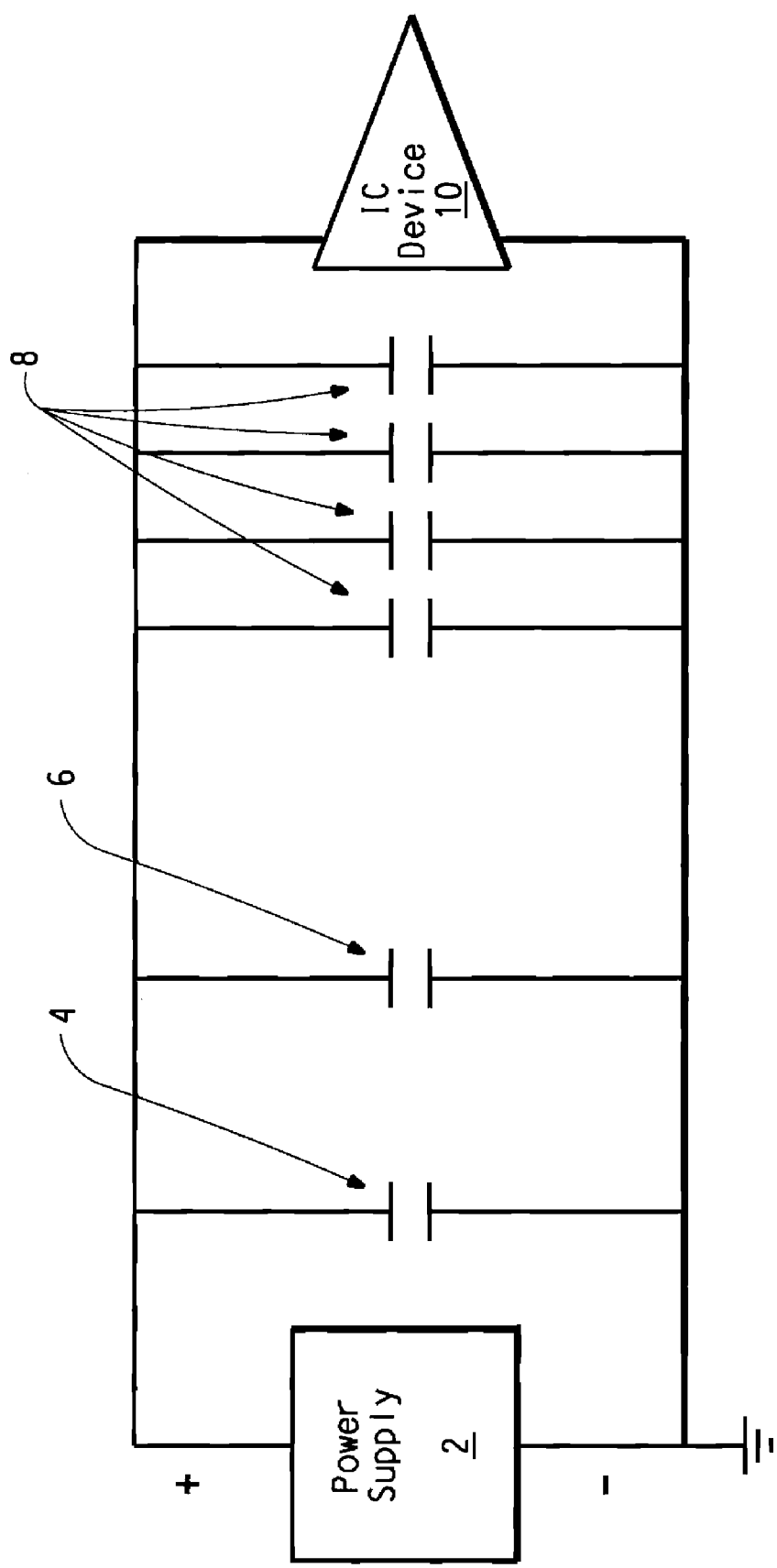
FIG. 1 is a schematic illustration of typical prior art use of capacitors for impedance reduction and dampening power droop or overshoot.
Figure 2:
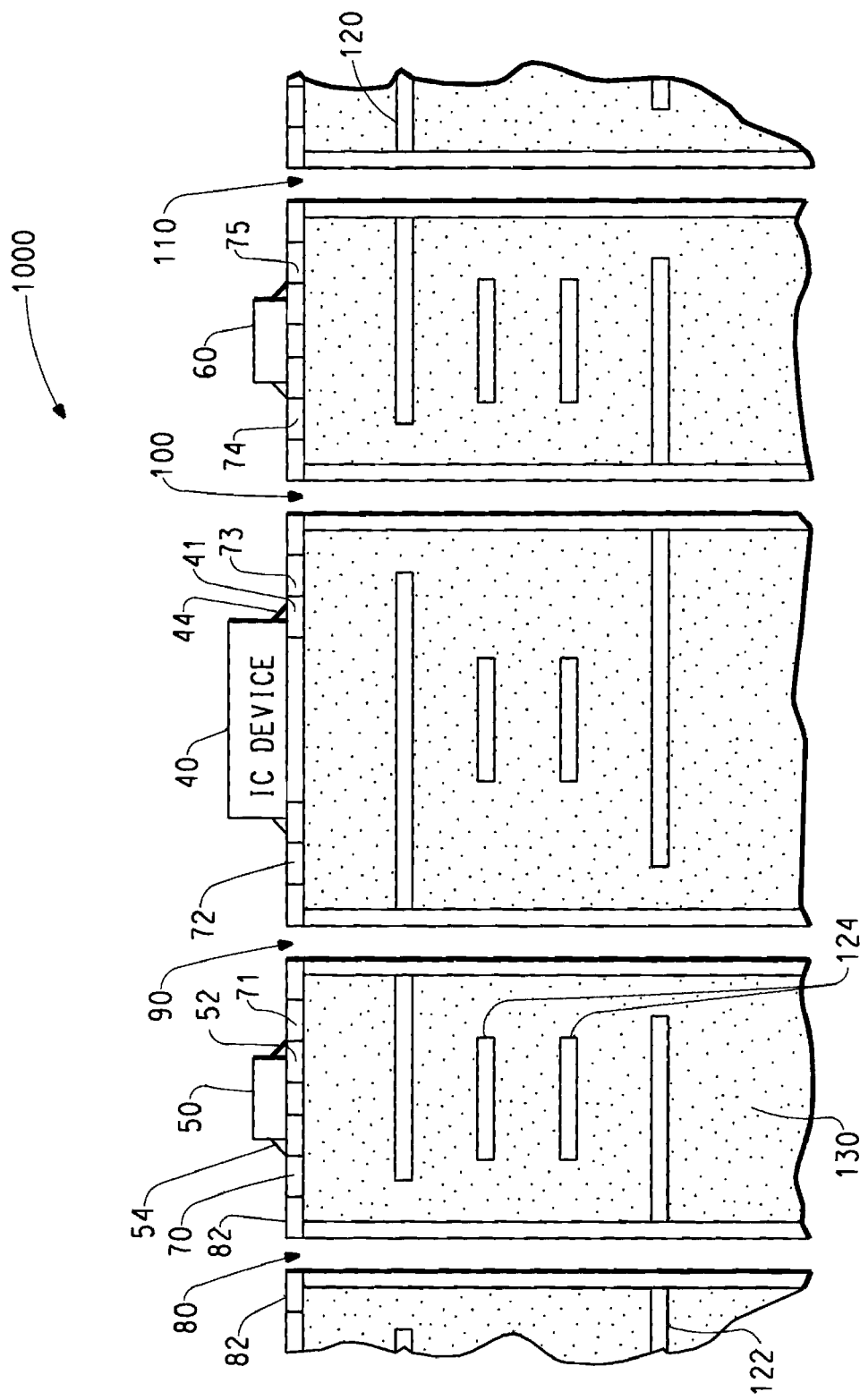
FIG. 2 is a representation in section view in front elevation of a printed wiring assembly having conventional prior art surface mount (SMT) capacitors used for impedance reduction and dampening power droop or overshoot.

According to a first embodiment, a design and manufacturing method of a power core device is disclosed in which singulated capacitors and planar capacitors are connected in parallel embedded within a laminate structure to create a power core structure. This power core structure is interconnected to at least one signal layer to form the power core device of the present invention. Singulated capacitors may be defined as individual capacitors formed on metal. Typically, the metal is a metal foil. Although we use the term "foil" herein, it is understood that foil encompasses a general metal layer, plated metal, sputtered metal, etc. The singulated capacitors in the power core structure are designed to be in close proximity (for example, in one embodiment, directly under the IC) for a rapid voltage response to the IC to support high switching speeds. Placing the singulated capacitors as close as possible to the power terminals of (for example, directly under) the IC also provides for low inductance connections. The planar capacitor is used as the power-ground planes and the power-ground plane separation is made thin to reduce high frequency impedance in the package.

FIG. 3 is a representation in section view in front elevation of one embodiment of a power core structure 500. A power core structure is interconnected to at least one signal layer to form the power core device of the present invention. The above power core allows for a foil containing the singulated capacitors to be formed with various materials and subsequently laminated to the planar capacitor to form the power core device. Such materials may include the use of high K ceramic-filled polymer thick-film capacitor dielectric and metal filled polymer thick-film electrode pastes screen-printed and cured on to the metal foil. Etching of conventional planar capacitor laminates, such as copper/polyimide/copper laminates like HK 04 obtainable from E. I. du Pont de Nemours and Company, may also be employed to form singulated capacitors on copper foil. Such polymer-based capacitors, however, have relatively low capacitance and it is generally desirable that the singulated capacitors have a high capacitance. In such a case, formed-on-foil techniques may be preferably employed to make singulated ceramic capacitors on copper foil using ceramic compositions. Such capacitors may be formed from thin-film or thick-film approaches. The foil containing said capacitors may be laminated to the planar capacitor using standard printed wiring board lamination processes to form the power core structure.

The above power core also allows for the planar capacitor to be formed using various materials. Such materials may include metal foil-dielectric-metal foil laminate structures wherein the dielectric may comprise an organic layer, a ceramic-filled organic layer, or a ceramic layer. Where multiple layers are used, layers may be of different materials. Such dielectrics would be manufactured with thin layers for impedance reduction. The planar capacitor may be laminated to the capacitors formed-on-foil by standard printing wiring board lamination processes to form the power core device.

According to the above embodiment, both the low impedance and high capacitance functions may be integrated into a single power core structure that can be further integrated into another laminate structure, permitting operation of highspeed ICs at lower voltages with reduced voltage ripple. When the power core structure is incorporated in a power core device, such as a printed wiring board, module, interposer, or package, valuable real estate becomes available. Further, solder joints associated with SMT devices may be eliminated, thereby improving reliability. The power core structure can be processed using conventional printed wiring board processes, further reducing production costs.

Those skilled in the art will appreciate the above stated advantages and other advantages and benefits of various embodiments of the invention upon reading the detailed description of the embodiments with reference to the figures listed above and detailed below.

According to common practice, the various features of the drawings are not necessarily drawn to scale. Dimensions of various features may be expanded or reduced to more clearly illustrate the embodiments of the invention.

Embodiments of the present invention are addressed to a power core structure that may be buried in the substrate of a printed wiring board (PWB), module, interposer, or package. Providing the low inductance and high capacitance functions of the power core within the PWB, module, interposer, or package substrate conserves valuable surface real estate on the PWB, module, interposer, or package and also requires fewer solder joints than conventional SMT capacitor arrangements.

FIG. 3 illustrates, in side elevation, a power core device 500 comprising a planar capacitor laminate 340 and formed-on-foil singulated capacitors 240 according to a first embodiment.

Figure 4B:
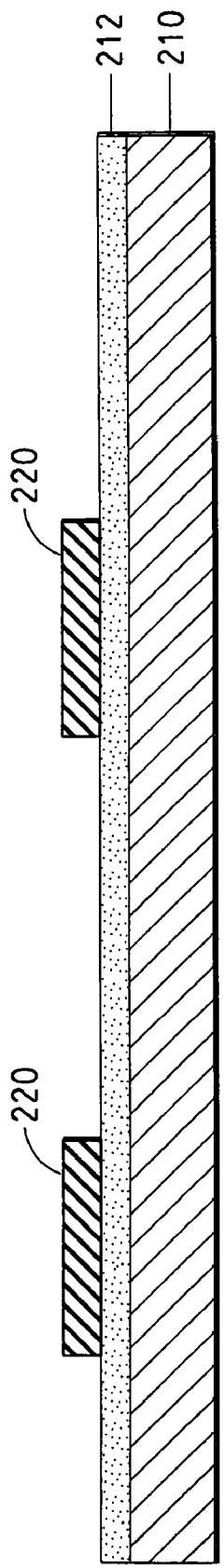
Figure 4C:
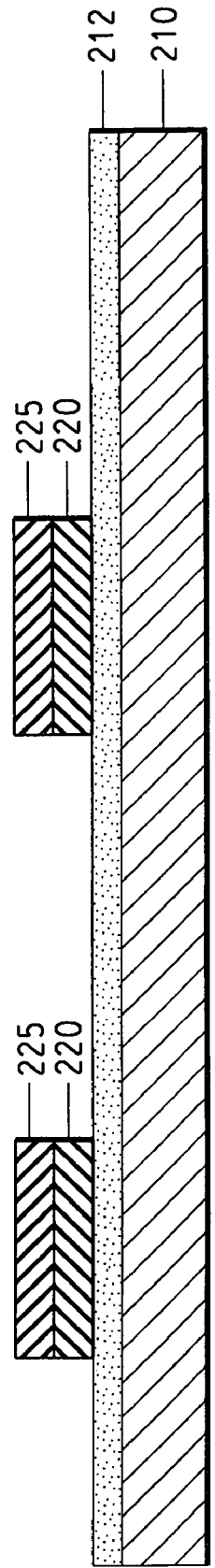
Figure 4D:
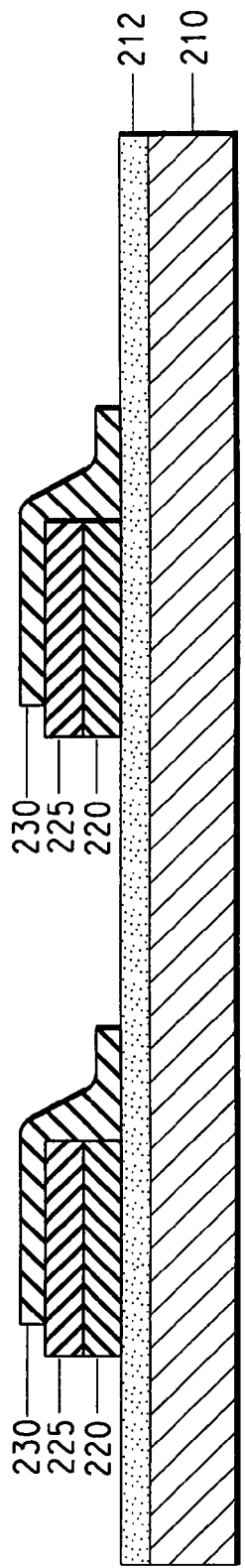
Figure 4E:
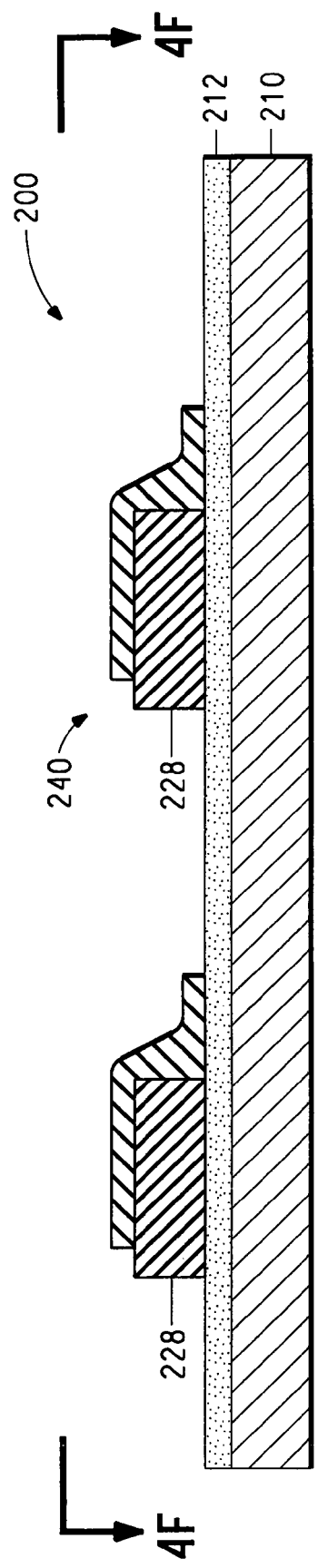
Figure 4F:
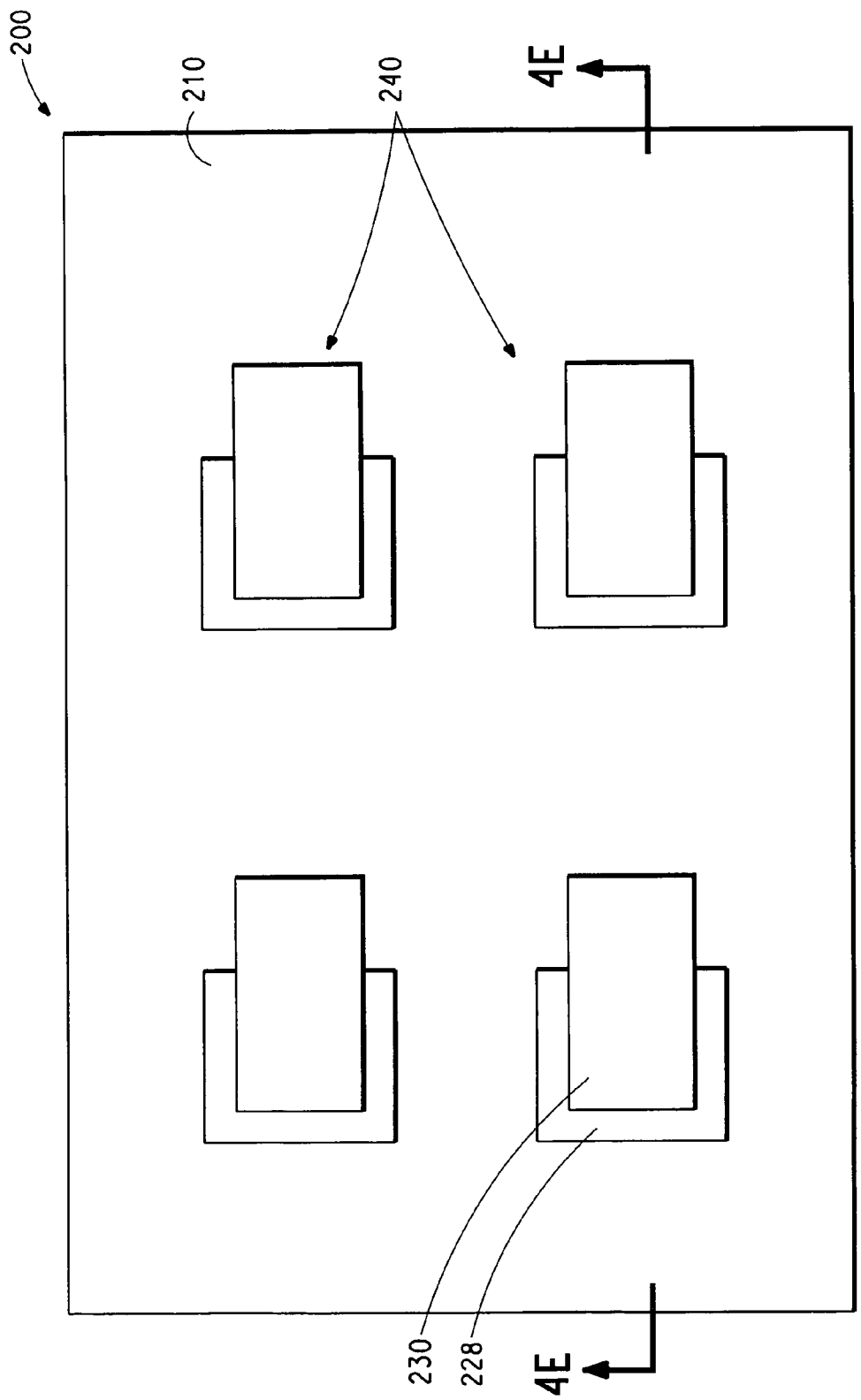

FIGS. 4A-4F illustrate, in side elevation, a general method of manufacturing single-layer formed-on-foil singulated capacitors (typically fired on foil). FIG. 4F is a plan view of the finished formed-on-foil capacitors. Specific examples of thick-film fired-on-foil capacitors are described below to illustrate one embodiment of the present invention.

FIG. 4A is a side elevational view of a first stage of manufacturing the singulated capacitor structure 200. In FIG. 4A, a metallic foil 210 is provided. The foil 210 may be of a type generally available in the industry. For example, the foil 210 may be copper, copper-invar-copper, invar, nickel, nickel-coated copper, or other metals that have melting points in excess of the firing temperature for thick-film pastes. Preferred foils include foils comprised predominantly of copper, such as reverse treated copper foils, double-treated copper foils, and other copper foils commonly used in the multilayer printed circuit board industry. The thickness of the foil 210 may be in the range of, for example, about 1-100 microns, preferably 3-75 microns, and most preferably 12-36 microns, corresponding to between about ⅓ oz and 1 oz copper foil. An example of a suitable foil is PLSP grade 1 ounce copper foil obtainable from Oak-Mitsui.

The foil 210 may be pretreated by applying an underprint 212 to the foil 210. The underprint 212 is a relatively thin layer applied to a component-side surface of the foil 210. In FIG. 4A, the underprint 212 is indicated as a surface coating on the foil 210. The underprint 212 adheres well to the metal foil 210 and to layers deposited over the underprint 212. The underprint 212 may be formed, for example, from a paste applied to the foil 210, and is then fired in an inert atmosphere at a temperature below the melting point of the foil 210. The paste may be printed as an open coating over the entire surface of the foil 210, or printed on selected areas of the foil 210. It is generally more economical to print the underprint paste over selected areas of the foil. When a copper foil 210 is used in conjunction with a copper underprint 212, glass in the copper underprint paste retards oxidative corrosion of the copper foil 210, and it may therefore be preferable to coat the entire surface of the foil 210 if oxygen-doped firing is utilized. An example of a suitable copper underprint is EP 320 available from E. I. du Pont de Nemours and Company.

In FIG. 4B, a capacitor dielectric material is screen-printed onto the pretreated foil 210, forming a first capacitor dielectric layer 220. The capacitor dielectric material may be, for example, a thick-film dielectric ink. The dielectric ink may be formed of, for example, a paste. An example of a suitable capacitor dielectric paste is EP 310 obtainable from E. I. du Pont de Nemours and Company. The first capacitor dielectric layer 220 is then dried. In FIG. 4C, a second capacitor dielectric layer 225 is then applied, and dried. In an alternative embodiment, a single layer of capacitor dielectric material may be deposited through a coarser mesh screen to provide an equivalent thickness in one printing.

In FIG. 4D, an electrode layer 230 is formed over the second dielectric layer 225 and dried. The electrode layer 230 can be formed by, for example, screen-printing a thick-film metallic ink. When a copper foil 210 is used in conjunction with a copper underprint 212, a copper electrode may be used. An example of a suitable copper electrode paste is EP 320 obtainable from E. I. du Pont de Nemours and Company. In general, the surface area of the dielectric layer 225 should be larger than that of the electrode layer 230.

The first capacitor dielectric layer 220, the second capacitor dielectric layer 225, and the electrode layer 230 are then co-fired. Firing may be accomplished, for example, at a peak temperature of 900° C. in a nitrogen thick-film furnace. The thick-film capacitor dielectric layers 220, 225 may be formed of, for example, a high dielectric constant functional phase such as barium titanate, various dopants and a glass frit phase. During co-firing, the glass frit phase softens, wets the functional and dopant phases and coalesces to create a dispersion of the functional phase and the dopants in a glass-ceramic matrix. At the same time, the copper electrode powders of the electrode layer 230 are wetted by the softened glass frit phase and sinter together to form a solid electrode. The electrode layer 230 has a strong bond to the high K dielectric 228 that results from the co-firing. The post-fired structure is shown in front elevation in FIG. 4E.

FIG. 4F is a plan view of the finished capacitor structure 200. In FIG. 4F, four capacitor 240 structures 240 on the foil 210 are illustrated. Any number of capacitors structures 240, in various patterns, however can be arranged on a foil 210.

In the formed-on-foil capacitor discussed in this specification, the term "paste" or "ink" may correspond to a conventional term used in the electronic materials industry, and generally refers to a thick-film composition. Typically, the metal component of the underprint paste is matched to the metal in the metal foil. For example, if a copper foil were used, then a copper paste could be used as the underprint. Examples of other applications would be pairing silver and nickel foils with a similar metal underprint paste. Thick film pastes may be used to form both the underprint and the passive components.

Generally, thick-film pastes comprise finely divided particles of ceramic, glass, metal or other solids dispersed in polymers dissolved in a mixture of plasticizer, dispersing agent and organic solvent. Preferred capacitor pastes for use on copper foil have an organic vehicle with good burnout in a nitrogen atmosphere. Such vehicles generally contain very small amounts of resin, such as high molecular weight ethyl cellulose, where only small amounts are necessary to generate a viscosity suitable for screen-printing. Additionally, an oxidizing component such as barium nitrate powder, blended into the dielectric powder mixture, helps the organic component burn out in the nitrogen atmosphere. Solids are mixed with an essentially inert liquid medium (the "vehicle"), then dispersed on a three-roll mill to form a paste-like composition suitable for screen-printing. Any essentially inert liquid may be used as the vehicle. For example, various organic liquids, with or without thickening and/or stabilizing agents and/or other common additives, may be used as the vehicle.

High dielectric constant, (high K) thick-film capacitor dielectric pastes generally contain at least one high K functional phase powder and at least one glass powder dispersed in a vehicle system composed of at least one resin and a solvent. The vehicle system is designed to be screen-printed to provide a dense and spatially well-defined film. The high K functional phase powders may be described as powders that have bulk dielectric constant above 500 and can comprise perovskite-type ferroelectric compositions with the general formula $ABO_3$. Examples of such compositions include $BaTiO_3$; $SrTiO_3$; $PbTiO_3$; $CaTiO_3$; $PbZrO_3$; $BaZrO_3$ and $SrZrO_3$ or mixtures thereof. Other compositions are also possible by substitution of alternative elements into the A and/or B position, such as $Pb(Mg_{1/3} Nb_{2/3})O_3$ and $Pb(Zn_{1/3} Nb_{2/3})O_3$. A suitable high K functional phase powder is barium titanate obtained from Fuji Titanium. Doped and mixed metal versions of the above compositions are also suitable. Doping and mixing is done primarily to achieve the necessary end-use property specifications such as, for example, the necessary temperature coefficient of capacitance (TCC) in order for the material to meet industry definitions, such as "X7R" or "Z5U" standards.

The glasses in the pastes can be, for example, Ca—Al borosilicates, Pb—Ba borosilicates, Mg—Al silicates, rare earth borates, and other similar glass compositions. High K glass-ceramic powders, such as lead germanate ($Pb_5Ge_3O_{11}$), are preferred.

Pastes used to form the electrode layers may be based on metallic powders of either copper, nickel, silver, silver-containing precious metal compositions, or mixtures of these compounds. Copper powder compositions are preferred.

The capacitor structure described in this specification may be manufactured using multiple layers of dielectric and electrodes to increase the capacitance.

In the above example, the dielectric is described as formed by screen printing thick-film paste. Other methods however, such as deposition by solution coating, cast on copper process, or sputtering may also be used. Alternatively, a dielectric may be applied and then photo defined. In addition, the electrode layers are described as formed by screen-printing. Other methods, however, such as deposition by sputtering, plating or evaporation of electrode metals onto the dielectric layer surface may also be used. Additionally, photodefined pastes may also be used.

FIGS. 5A-5B illustrate, in side elevation, a general method of manufacture of a planar capacitor laminate.

FIG. 5A is a section view in front elevation of the first stage of manufacture of a planar capacitor laminate 320, illustrated in FIG. 5B, in which a first metal foil 310 is provided. The foil 310 may be made from, for example, copper, copper-based materials, and other metals. Preferred foils include foils comprised predominantly of copper, such as reverse treated copper foils, double-treated copper foils, and other copper foils commonly used in the multilayer printed circuit board industry. Examples of some suitable copper foils are those which are available from Olin Brass (Somers Thin Strip) and JEC. The thickness of the foil 310 may be in the range of, for example, about 1-100 microns, preferably 3-75 microns, and most preferably 12-36 microns, corresponding to between about ⅓ oz and 1 oz copper foil.

A slurry material or a solution may be cast or coated onto foil 310, dried and cured, forming a first dielectric layer 312, the result being a coated metal foil 300. The dielectric layer or layers of the laminate may be selected from organic, ceramic, ceramic filled organic and layers of mixtures thereof. Curing may be performed by baking, for example, at 350° C., if the slurry is of a thermoplastic nature. Higher curing temperatures can be used if the slurry is a thermoset material. Curing may be performed by drying, for example, at 120-200° C., if the polymer is intended to be only partially cured to create a "B" stage state of the polymer.

Solutions used to form the dielectric layer 312 may comprise, for example, a polymer dissolved in a solvent. Slurry materials may comprise, for example, a polymer-solvent solution with a high dielectric constant ("high K") filler/ ceramic filler or functional phase. Suitable polymers for slurry or solution may include, but are not limited to, for example, epoxy or polyimide resins. High K functional phases may be defined as materials with dielectric constants of greater than 500 and may include perovskites of the general formula $ABO_3$. Suitable fillers include, for example, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate. Fillers may be in powder form. A suitable high K filler phase is barium titanate obtainable from Ferro Corporation, Tam Ceramics or Fuji Titanium.

Functional phases with dielectric constants below 500 may also be appropriate for other reasons. Such materials may include the oxides of titanium, tantalum, hafnium and niobium.

If the dielectric 312 is thermoplastic in nature or only partially cured, two pieces of the coated metal foil 300 may be laminated together under heat and pressure in the direction shown by the arrows in FIG. 5A to form the laminate structure 320 illustrated in FIG. 5B.

If the dielectric 312 is thermoset in nature, a thin adhesive layer may be applied to one or both of the dielectric layers 312. Commercial thermoset dielectrics include polyimide grades available from E. I. du Pont de Nemours and Company.

Referring to FIG. 5B, lamination forms a single dielectric 314 from the layers 312. The resulting dielectric 314 can be, for example, a thin layer, on the order of 4-25 microns after lamination. One embodiment of the planar capacitor laminate is a copper-dielectric-copper laminate. Embedded capacitor materials and processes that can used to form metal-dielectric metal structures include Probelec 81 CFP from Vantico licensed to Motorola and resin coated foil products such a MOF 6000E from Hitachi Chemical Company, MR-600 from Mitsui Metal and Smelting Co., Ltd., R-0880 from Matsushita Electric Works, Ltd., and APL-4000 from Sumitomo Bakelite Co., Ltd.

An alternative method of forming the dielectric 314 may be to cast a filled or unfilled thermoplastic polymer onto the foil 310 and to directly laminate a second, uncoated foil to the filled thermoplastic polymer. Yet another alternative method of manufacture includes forming the dielectric layer 314 separately as a single film and laminating it to a first foil 310 and a second foil 310 using heat and pressure. Yet another alternative method of manufacture includes forming the dielectric layer 314 separately as a single film and sputtering a metallic seed layer onto both sides of said separately formed dielectric layer and then plating additional metal onto the seed layer using electroless or electrolytic plating techniques. Suitable capacitor laminates include Interra™ HK 04 Series from E. I. du Pont de Nemours and Company, Interra™ HK 11 Series from E. I. du Pont de Nemours and Company, BC-2000 and BC-1000 from laminators licensed by Sanmina, FaradFlex Series from Oak-Mitsui Technologies, InSite™ Embedded Capacitor Series from Rohm and Haas Electronic Materials, TCC™ from Gould Electronics, and C-Ply from 3M.

FIGS. 6A-6B illustrate, in side elevation, a general method of preparation of a planar capacitor laminate for manufacture of the power core device.

FIG. 6A shows, in side elevation, the planar capacitor laminate 320 from FIG. 5B. A photoresist (not shown in FIG. 6A) is applied to each of the foils 310. However only one of the photoresists is imaged and developed so that only one of the foils 310 is etched. All remaining photoresist is then stripped using standard printing wiring board processing conditions. An example of a suitable photoresist would be Riston® Photoresist available from E. I. du Pont de Nemours and Company.

FIG. 6B shows, in side elevation, the resulting etched laminate, 340, illustrating one side has had portions of foil 310 removed by etching while the other foil 310 remains intact.

Referring to FIG. 7, the foil 210 containing the thick-film formed-on-foil capacitors 240 are laminated to the planar capacitor layer 340. The capacitor-on-foil structure may be inverted and the component face of the foil laminated to the etched side of the planar capacitor laminate 340 to form the power core structure subpart as shown in FIG. 7. Alternatively, the foil side of the capacitor on foil structure may be laminated to the etched side of the planar capacitor laminate. The lamination can be performed, for example, using FR4 epoxy prepreg 360 in standard printing wiring board processes. In one embodiment, epoxy prepreg type 106 may be used. Suitable lamination conditions may be 185° C. at 208 psig for 1 hour in a vacuum chamber evacuated to 28 inches of mercury. A silicone rubber press pad and a smooth PTFE filled glass release sheet may be in contact with the foils 210 and 310 to prevent the epoxy from gluing the lamination plates together. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation. A release sheet may be in contact with the foils to prevent the epoxy from gluing the lamination plates together between circuit layers. The resulting subpart 400 is encapsulated by foil 210 on one side and foil 310 on the other.

One skilled in the art would understand that alternative designs of the power core may include laminating said singulated capacitor layer component side up to said patterned planar capacitor laminate. Such approaches would require different etching patterning and via formation to connect the appropriate layers. Alternative designs such as these may achieve the same design requirements.

Alternative etching patterns may also be used with the device embodiments as described above (i.e., a face down) to yield similar electrical functions. Referring to FIG. 8, after lamination, a photo-resist is applied to the formed-on-foil capacitor foil 210 and the planar capacitor foil 310. The photo-resist is imaged, developed and the metal foils are etched and the photoresist is stripped using standard printing wiring board processing conditions. The etching produces a trench 265 in the foil 210, which breaks electrical contact between the first electrode 230 and the foil 210 creating a second electrode 270 from foil 210. Any associated circuitry is also created from foil 210. The etching also produces electrodes 280 and associated circuitry on the planar capacitor foil 310.

It should be understood that the power core may be formed by other sequences of lamination of layers, for example, by first laminating the imaged side of the planar capacitor laminate 340 shown in FIG. 6 to other printed wiring board layers, applying photoresist to the unimaged foil 310, etching the foil, stripping the photoresist, and then laminating the embedded singulated capacitor layer to the planar capacitor laminate.

FIGS. 9-15 represent various section views in front elevation of FIG. 8, which result in final embodiments of a power core device. The power core structure 500, comprising a planar capacitor laminate 340 and an embedded singulated capacitor 240 can be incorporated into a plurality of packages, termed "power core packages." The power core package may be a printed wiring board, IC package, module, interposer, or the like.

Figure 9:
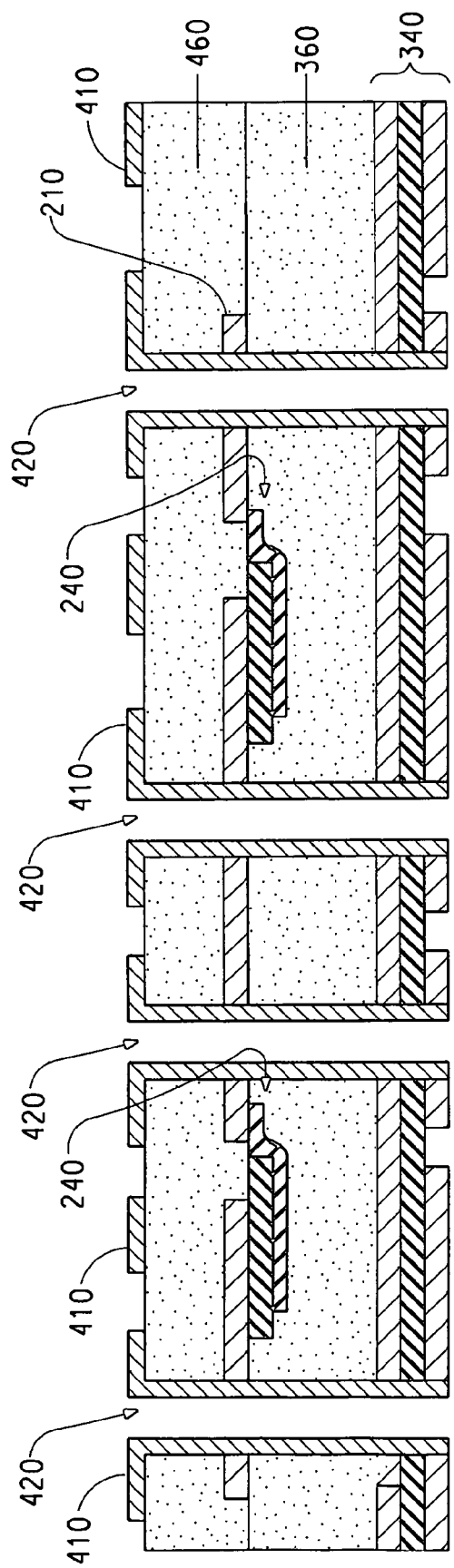
FIGS. 9-15 represent various section views in front elevation which result in final embodiments of a power core device.

FIG. 9 is a representation in section view in front elevation of a power core structure 500 wherein an additional prepreg layer 460 and metallic layer 410 have been laminated to the core. Additionally, drilled, plated through hole vias 420 have been formed. These through-hole vias 420 are metallized and may be filled with conductive pastes or inks or with non-conductive material.

Figure 10:
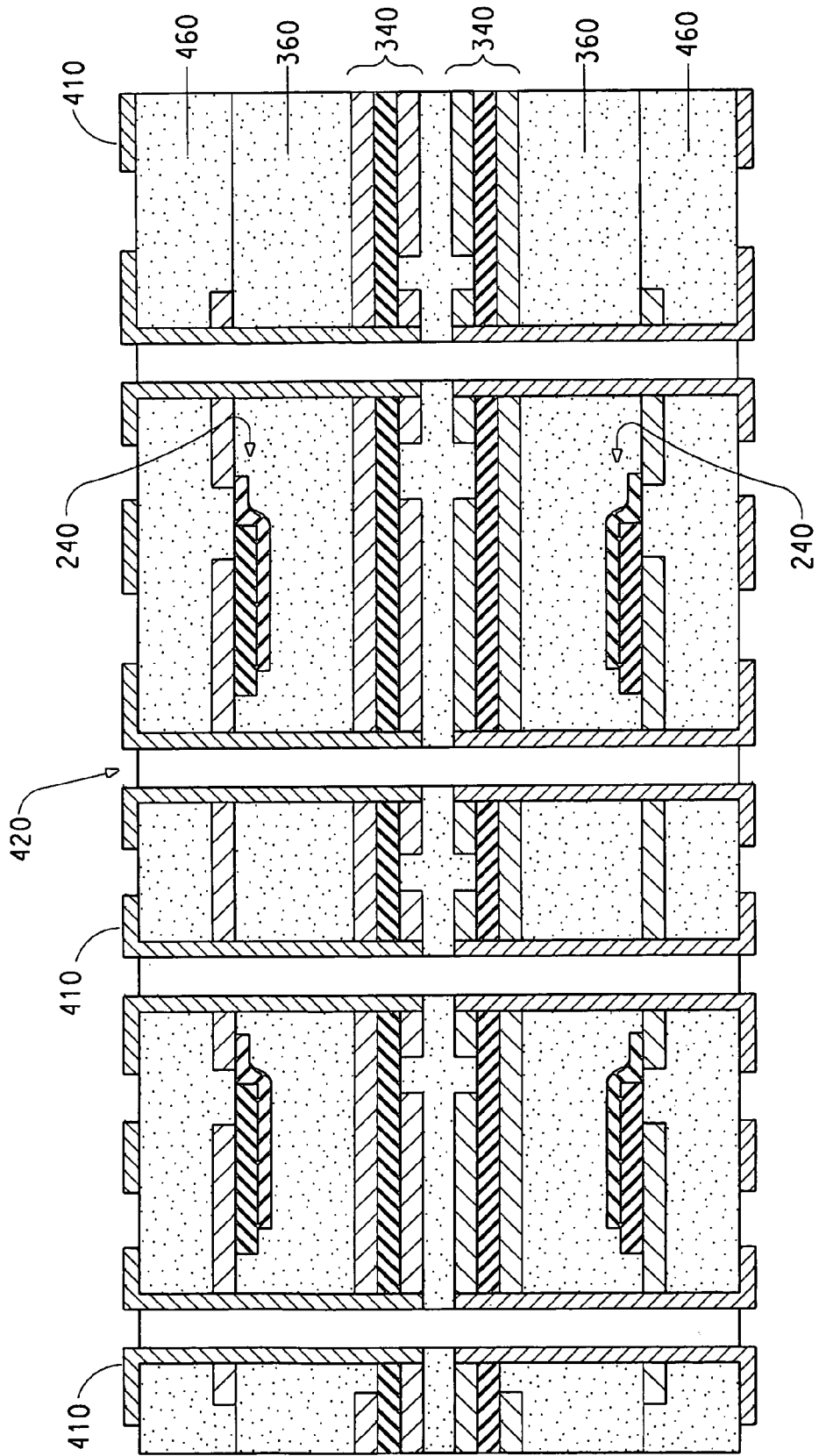

FIG. 10 is a representation in section view in front elevation of a symmetrical (balanced) stack-up power core configuration. This embodiment of the power core structure may be utilized if mechanical considerations, such as avoidance of warp, warrant it. This represents one embodiment of the present invention wherein the power core structure comprises multiple embedded singulated capacitor layers and multiple planar capacitor layers.

Figure 11:
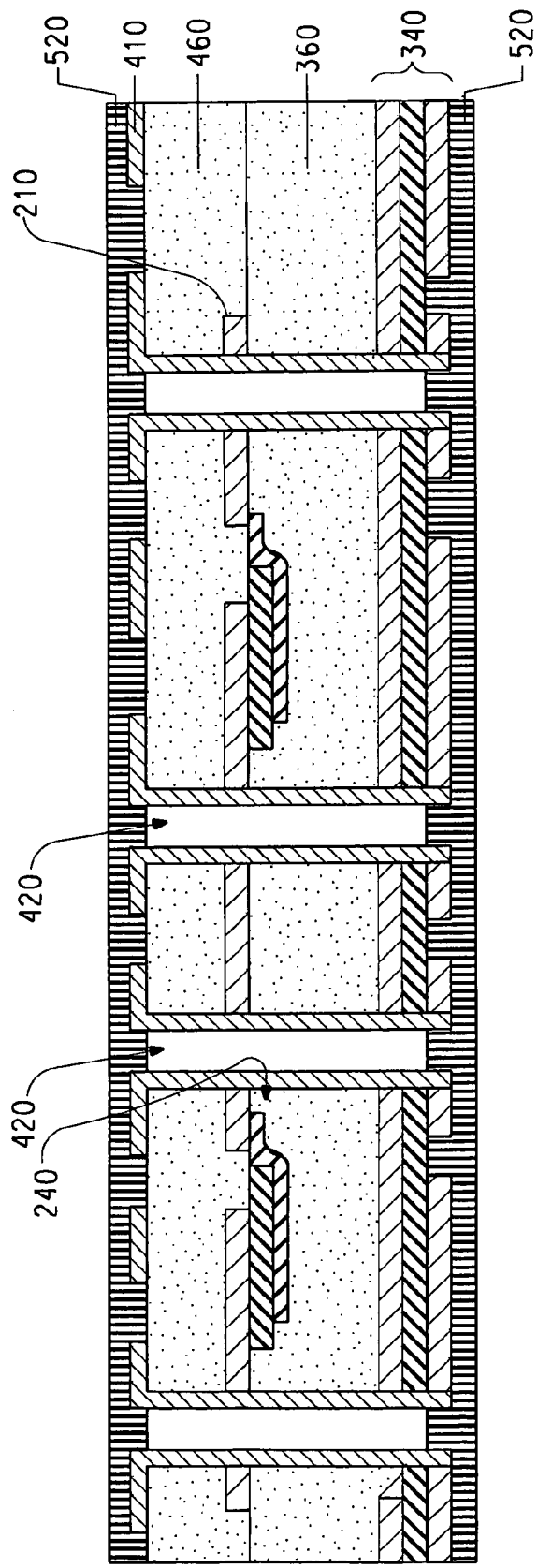

FIG. 11 is a representation in section view in front elevation of a power core wherein combined "build-up" layers of dielectric film 520 have been applied (typically laminated) to the core. Build-up layers may be arranged symmetrically or asymmetrically around the power core. The build-up layers may be applied (laminated) as a dielectric film, a liquid (spin-coated or curtain-coated), or a resin coated on a metallic layer (for example copper foil), or as a reinforced prepreg, for example B-stage resin. The reinforcement may be woven or non-woven, inorganic (for example glass) or organic (for example aramid fiber).

Figure 12:
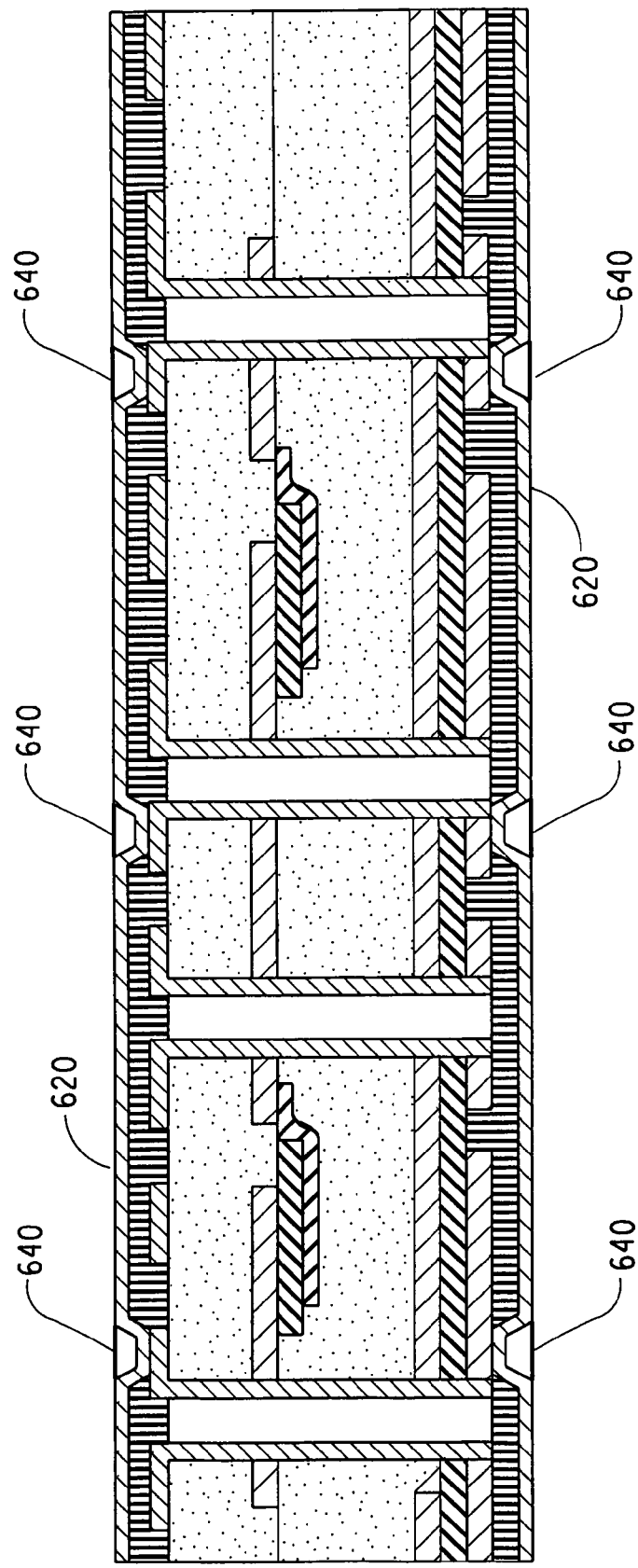

FIG. 12 is a representation in section view in front elevation of a power core structure with additional "build-up" layers that contain metallized microvia connections and circuits on the surface of the build-up layer. The microvias 640 can be formed by laser drilling, by photolithography, or by controlled-depth mechanical drilling. Initial metallization of the build-up layer surface and microvia hole-walls is achieved by depositing a metal seed layer, for example electroless copper. The seed layer deposition may be activated by catalyst deposited on the surface, for example in one embodiment, palladium, or a catalyst or metal precursor dispersed throughout the build-up layer. Alternatively, the build-up layer may be capped by a metallic layer (copper foil), onto which the metal seed layer is deposited after microvia drilling.

Figure 13:
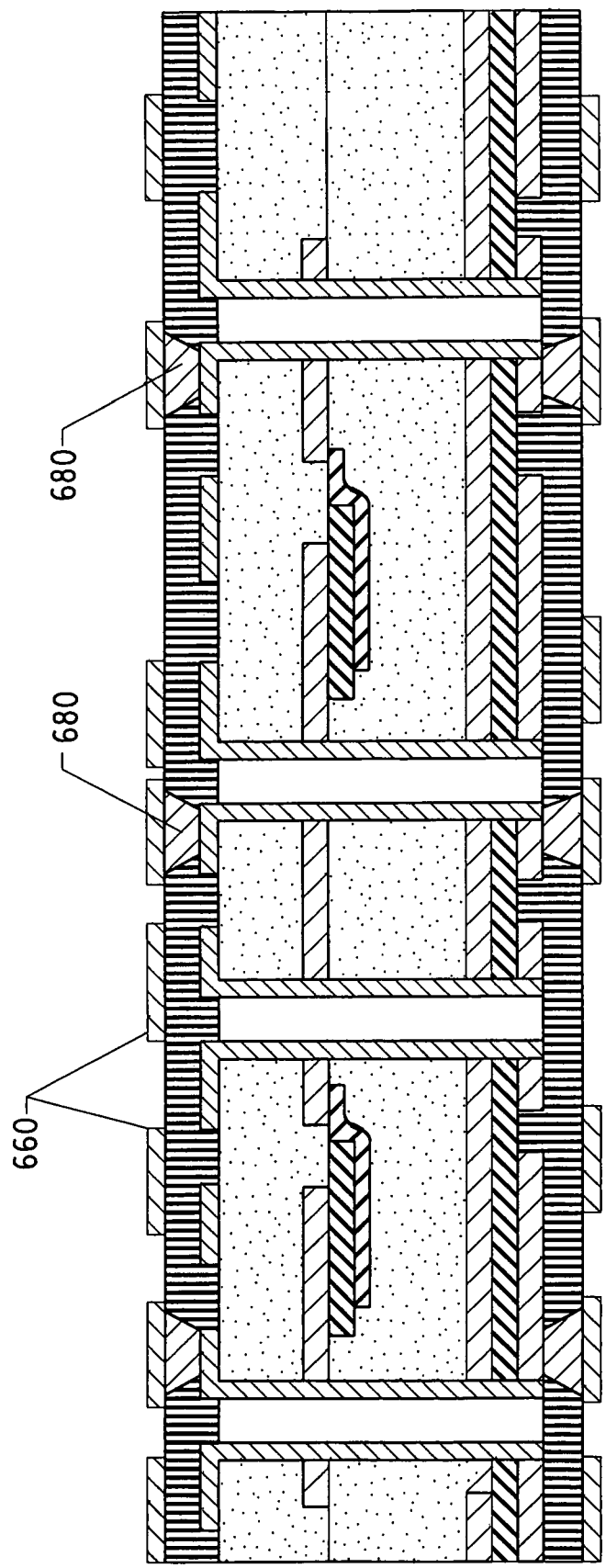

FIG. 13 is a representation in section view in front elevation of a power core structure comprising patterned conductors on the surface of the build-up layer. Starting with a contiguous metal cover over the build-up layer, conductor patterning can be done with a semi-additive process (SAP), or a "tent & etch" process, or by pattern plating, or by a modified panel plate/tent & etch process. FIG. 13 shows the patterned conductor 660 on the surface of a build-up layer.

Microvias 640 may be filled with plated copper 680 during the electroplating process ("plating shut"), filled with a conductive ink or paste, filled with a non-conductive material, or left unfilled to be filled by a second dielectric build-up layer to be applied on top of the first one.

Figure 14:
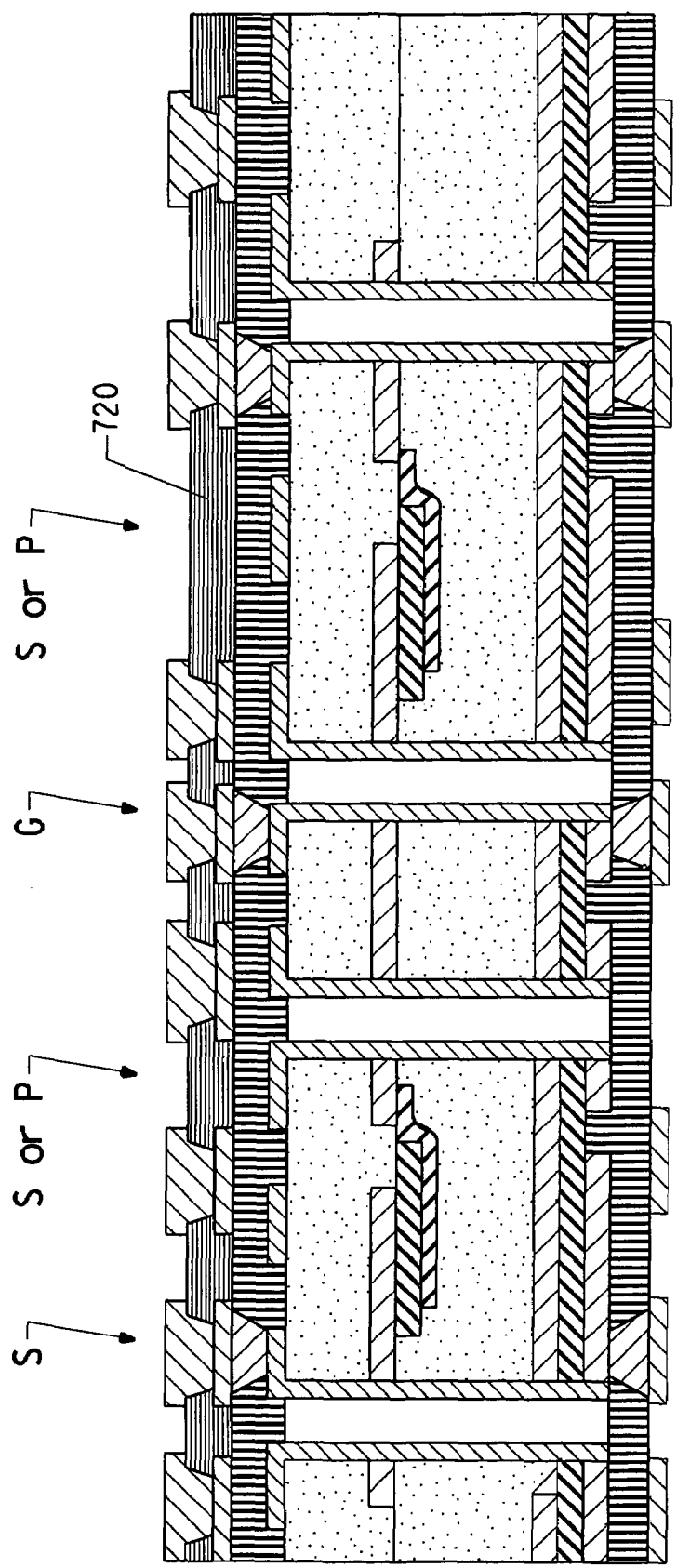

FIG. 14 is a representation in section view in front elevation of a power core structure comprising patterned conductors on the surface of the build-up layer and subsequent build-up layers which have been formed, metallized, and patterned in a similar fashion. FIG. 14 further illustrates that a planar capacitance layer 720 may be incorporated into the build-up dielectric. Microvias may be stacked relative to the position of underlying microvias or they may be staggered. Stacked vias need to be metal-filled. The package may then be connected to the bumps of a flip chip in a high temperature soldering step, and connected to a printed wiring board via solder joints in a lower temperature soldering step. It is understood that conductive, typically copper, features form contiguous connections to the solder joints through conductors in the X-Y-axis and vias in the Z-axis.

Figure 15:
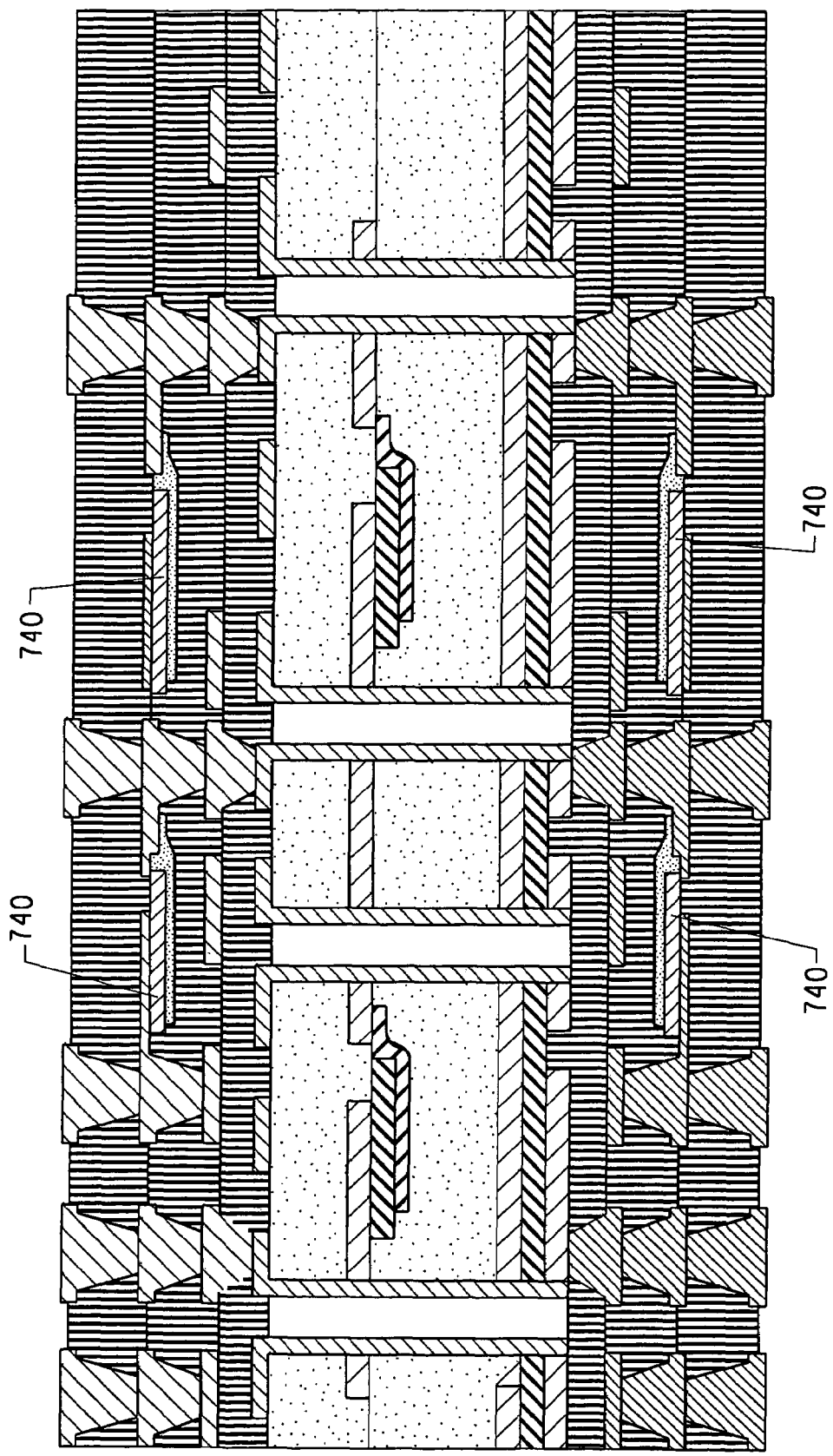

FIG. 15 illustrates that singulated capacitors 740 may also be incorporated into the build-up dielectric layer.

Figure 16:
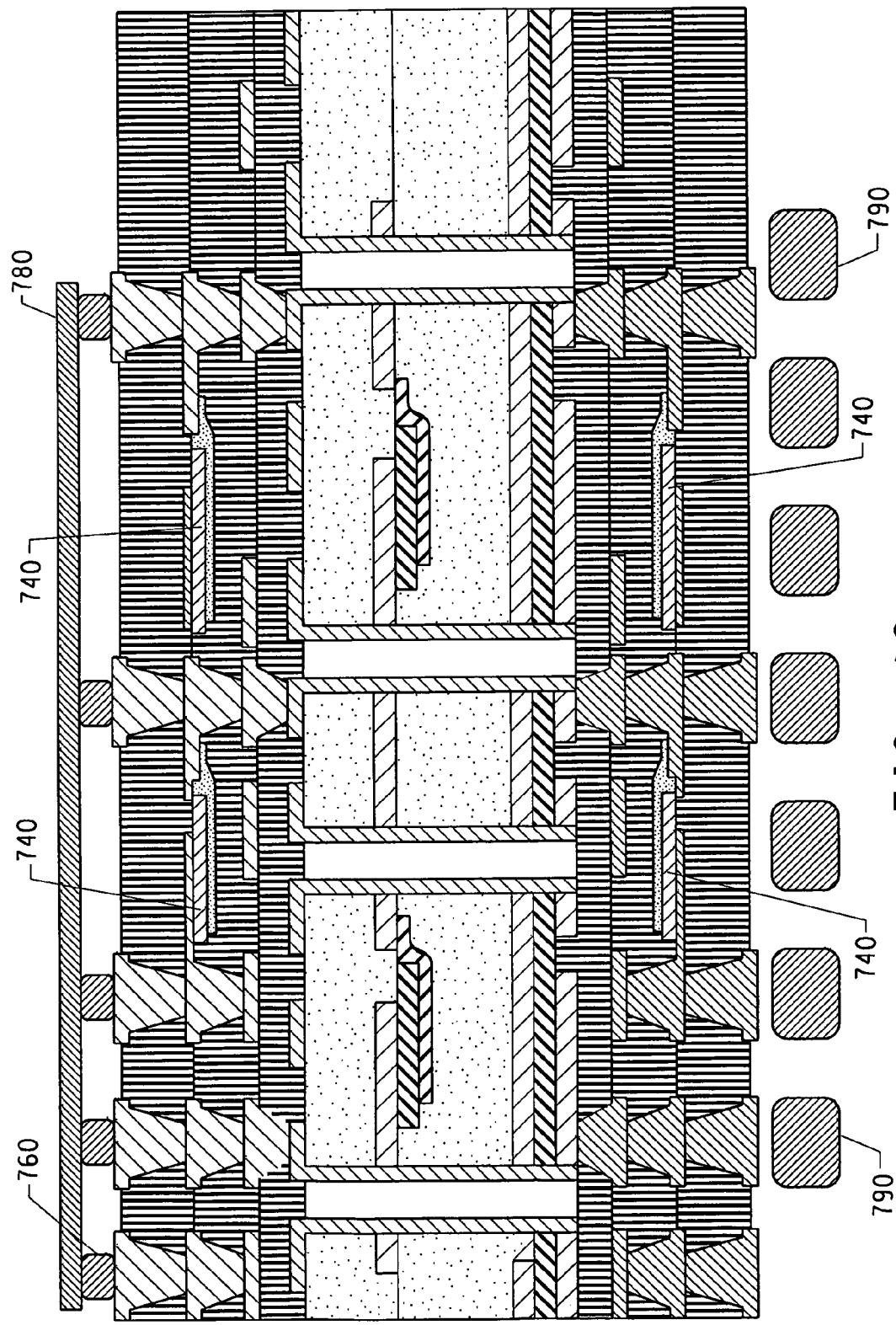
FIG. 16 is a representation in section view in front elevation of a power core device wherein the power core structure has been connected to the bumps of a flip chip and connected to a printed wiring board via solder joints.

FIG. 16 illustrates one embodiment of power core device where the power core structure has been connected to the bumps 760 of a flip chip 780 in a high temperature soldering step, and connected to a printed wiring board via solder joints 790 in a lower temperature soldering step.

FIG. 16 illustrates the connection of the embedded singulated capacitor (having a first and second electrode) to at least one terminal of a semiconductor device, for example in one embodiment a flip chip 780. This semiconductor device may be an integrated circuit.

Figure 17:
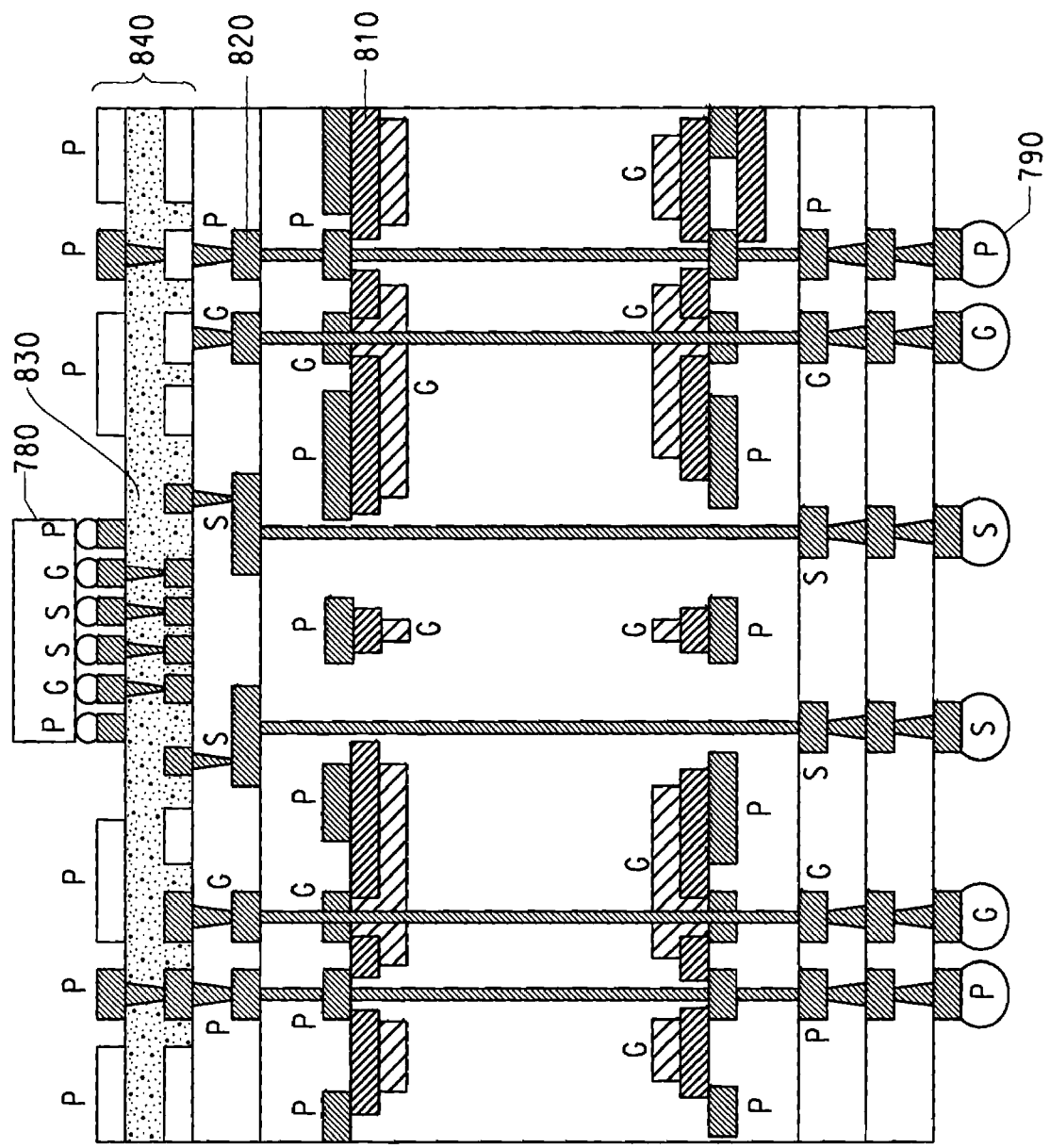
FIG. 17 is a representation in section view in front elevation of a power core device wherein the planar capacitor layer of the power core is formed as a build-up microvia film layer to form the top layer of a flip-chip ball-grid array structure.

FIG. 17 illustrates a further embodiment of a power core device. The embedded singulated capacitor 810 is connected in parallel to a planar capacitor 840 as a power core wherein the planar capacitor layer is formed as a build-up microvia film layer to form the top layer of a flip-chip ball-grid array structure. This embodiment of the power core device may utilize a ceramic-filled polymer film 830 to make the dielectric of the planar capacitor. The polymer film may be laminated as part of a sequential build process on an underlying microvia build-up layer. The underlying layer has metallic portions (typically copper) which may act as one electrode of the planar capacitor. After lamination of the polymer film, metallizations are formed onto the polymer film. Specifically, microvias and metallization lines are formed to allow for the routing of signal and power/ground terminals of the integrated circuit. The structure also has pads where the integrated circuit may be attached through solder bumps. In addition, the top electrode is formed to complete the planar capacitor structure. The planar capacitor is electrically connected to the appropriate power and ground features 820.

The power core devices of the present invention comprise a power core structure that is interconnected through at least one signal layer. The device may comprise more than one signal layer wherein the signal layers are connect through conductive vias.

Examples of vertical interconnects (via-fill, printed, etched, plated bumps) where layers are built individually and then laminated in one step may be utilized in the present invention. The combination of buried planar capacitors and buried discrete capacitors is also applicable to so called "coreless/stacked via packages". One example is the Any Layer Interstitial Via Hole (ALIVH) process (available through Matsushita). The ALIVH process may also incorporate planar and discrete capacitors. Another such stacked via process is the B²it process® (available through Toshiba Corporation) where planar and discrete capacitors can be incorporated in similar fashion. Other examples include the Neo Manhattan Bump Interconnection (NMBI) (North Corp.), and patterned prepreg lay-up process (PALAP)(Denso Corp.).

The devices of the present invention may be selected from an interposer, printed wiring board, multichip module, area array package, system-on package, system-in-package, and the like.

EXAMPLES

A structure containing planar capacitance laminates and discrete embedded ceramic capacitors was designed and tested. The planar capacitance laminates formed power distribution planes and the embedded capacitors were designed for placement on two internal metal layers. There were three different capacitor designs: Type A, Type B, and Type C. For each type, multiple capacitors with 1 mm², 4 mm², and 9 mm² effective capacitor size (area) were placed on each of the two internal metal layers. The capacitor designs differed in the relative position and size of the foil electrodes, the size of the dielectric, and the size of the screen printed copper electrode. They further differed in the design of the clearance (gap) that insulates the two copper foil electrodes, and they differed in the location and number of vias that connect the embedded capacitor to the next metal layer above. For example, in the 9 mm² size capacitors, Type A design featured 4 via connections, Type B had 28 vias, and Type C had 52 vias. For all three types the screen-printed conductor formed one electrode of the capacitor and the foil, separated by the dielectric from the screen-printed conductor, served as the other capacitor electrode.

Figure 18:
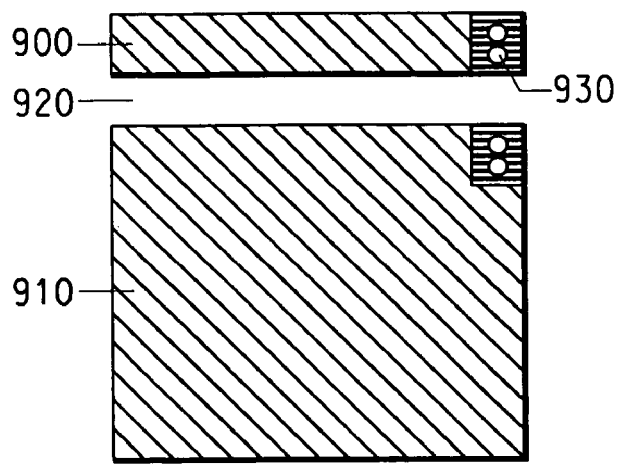
FIG. 18 is a Type A discrete capacitor design viewed from the foil side.

The Type A discrete capacitor design shown in FIG. 18, when viewed from the foil side, had a square form factor with the foil electrode (900) connecting to the screen-printed conductor extending across the width of the capacitor. This electrode was separated from the second foil electrode (910) serving as the other capacitor electrode by a 250-micron gap (920). This gap extended across the width of the capacitor. This second foil electrode extended across the width of the capacitor with a length about ⅘ths of the capacitor length. Via connections (930), 150 microns in diameter were formed to the next metal layer above the capacitor and were placed in the upper right corner, when viewed from the foil side, of each of the two electrodes. For all sizes two vias were used in each electrode.

Figure 19:
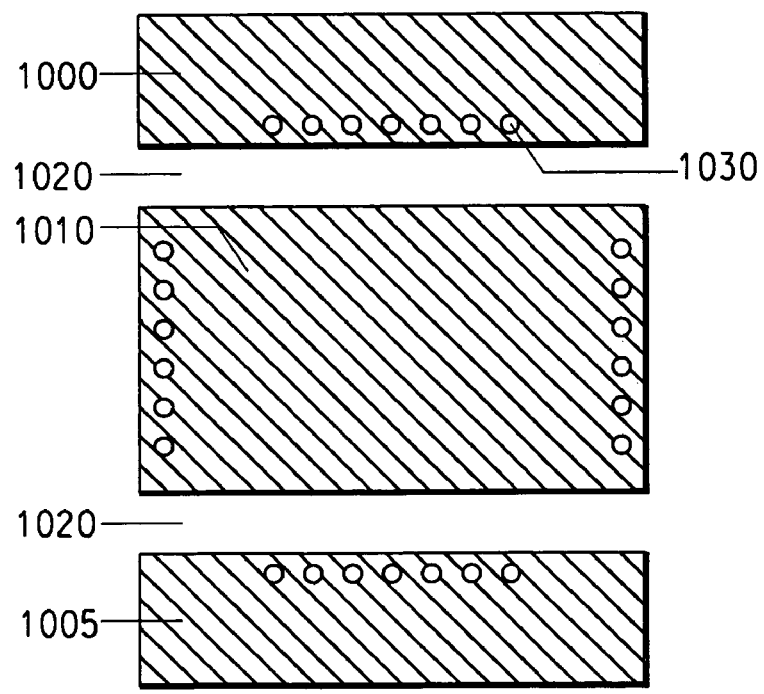
FIG. 19 is a Type B discrete capacitor design viewed from the foil side.

The Type B discrete capacitor design shown in FIG. 19, when viewed from the foil side, had a square form factor with two foil electrodes (1000, 1005) connected to the screen-printed conductor. Each electrode extended across the width of the capacitor at the top and bottom of the capacitor, each about ⅕ the length of the capacitor in length. These electrodes were separated from the second foil electrode (1010) serving as the other capacitor electrode by 250-micron gaps (1020) extending across the width of the capacitor. This second electrode (1010) was slightly less than ⅗ ths the length of the capacitor in length. Via connections (1030), 150 microns in diameter were formed to the next metal layer above the capacitor and were uniformly placed in a row across the width of the capacitor electrodes at the top and bottom of the capacitor, connecting to the screen-printed conductor. The second electrode of the capacitor had a row of vias along the length of each side of the capacitor. For the 9-mm² size, twenty-eight vias were used.

Figure 20:
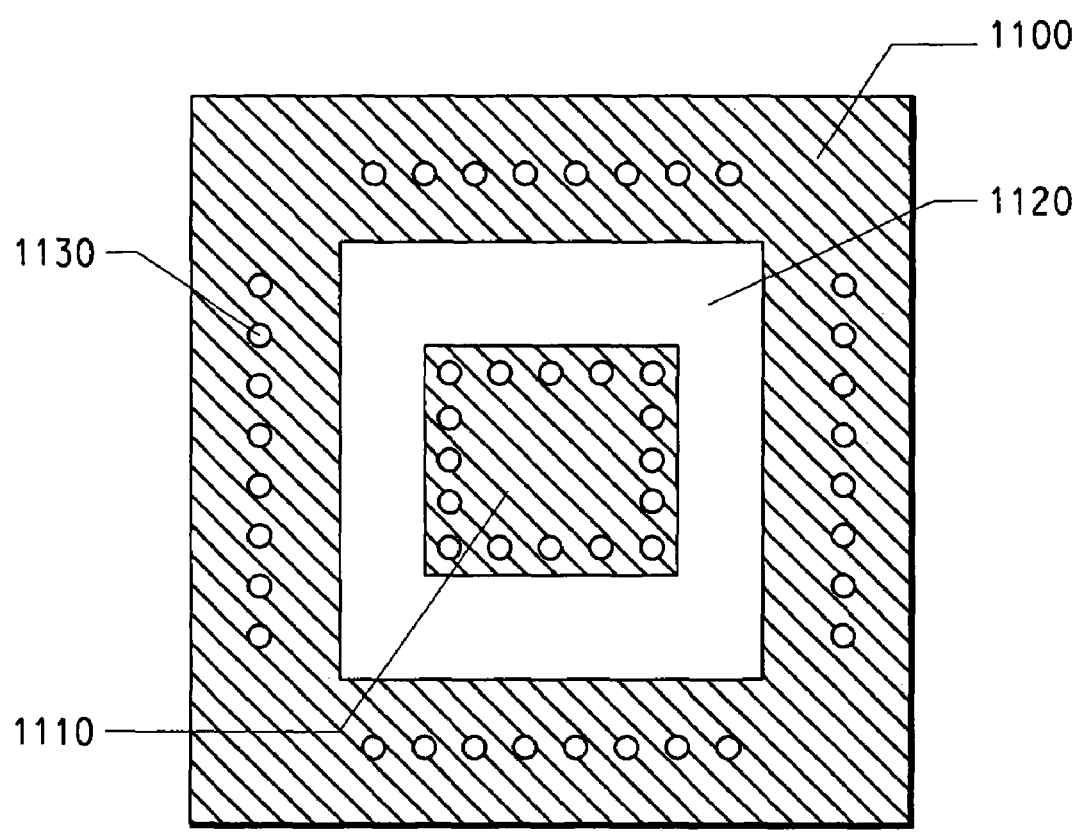
FIG. 20 is a Type C discrete capacitor design viewed from the foil side.

The Type C discrete capacitor design shown in FIG. 20, when viewed from the foil side, had a square form factor. The foil electrode (1100) connected to the screen-printed conductor formed a square "picture frame" like feature around the second capacitor electrode (1110). This second capacitor electrode was also square and was separated from the surrounding first electrode by a continuous 250-micron gap (1120). The 150-micron diameter via connections (1130) to the next metal layer above the capacitor were uniformly placed on all four sides of the first capacitor electrode connected to the screen printed conductor, a total of 32 vias for the 9-mm² size. The second electrode of the capacitor had 20 vias for the 9-mm² size, uniformly placed around the perimeter of the electrode.

The electrical parameters (capacitance, resistance, inductance) of individual capacitors, with and without via connections, were measured. The impedance vs frequency response for individual capacitors was measured and the measured responses were compared with the curves generated by a simulation model. The model was then used to simulate the impedance of several capacitor arrays, applying conservative, as well as, advanced design rules for the embedded capacitor arrays.

Results:

The capacitance, resistance, and inductance for Type A, B, and C type capacitors of 1, 4, and 9 mm² size, without via connections were measured using a Vector Network Analyzer and a two port measurement methodology using SOLT calibration. Coaxial style ground—signal probes with 500 micron spacing were used to measure capacitor S parameters and the real and imaginary impedance components of the capacitors were calculated. In Table 1 (without vias) and Table 2 (with vias), Capacitors 1, 4 and 9 are of the Type A design, Capacitors 2, 5 and 8 are of the Type B design and Capacitors 3, 6 and 7 are of the Type C design. Capacitors 1 through 3 were 1 mm×1 mm in size, capacitors 4 through 6 were 2 mm×2 mm in size, and capacitors 7 through 9 were 3 mm×3 mm in size.

TABLE 1

| | WITHOUT VIAS | | |
|---|---|---|---|
| | CAPACITANCE | ESR (RESISTANCE) | INDUCTANCE |
| CAPACITOR 1 | 1.26 nF | 36 mohms | 48 pH |
| CAPACITOR 2 | 1.17 nF | 50 mohms | 47.3 pH |
| CAPACITOR 3 | 1.63 nF | 34 mohms | 41.6 pH |
| CAPACITOR 4 | 5.15 nF | 8 mohms | 33.7 pH |
| CAPACITOR 5 | 5.16 nF | 10.7 mohms | 35.07 pH |
| CAPACITOR 6 | 6.16 nF | 10.7 mohms | 35.48 pH |
| CAPACITOR 9 | 10.6 nF | 7.9 mohms | 35.44 pH |
| CAPACITOR 8 | 11 nF | 10 mohms | 40 pH |
| CAPACITOR 7 | 13.6 nF | 8.9 mohms | 33.8 pH |

This shows that the capacitance increases with size, as expected, and does not vary much with the design type. Inductance values of all three types, without via connections, are fairly similar. The same parameters for capacitors of Type A, B, and C with via connections were measured using the same equipment and methodology.

TABLE 2

| | WITH VIAS | | |
|---|---|---|---|
| | CAPACITANCE | ESR (RESISTANCE) | INDUCTANCE |
| CAPACITOR 1 | 1.05 nF | 89 mohms | 382 pH |
| CAPACITOR 2 | 1.20 nF | 86.5 mohms | 125 pH |
| CAPACITOR 3 | 1.7 nF | 37.1 mohms | 74.6 pH |
| CAPACITOR 4 | 6.49 nF | 50.1 mohms | 308 pH |
| CAPACITOR 5 | 5.28 nF | 128 mohms | 120.5 pH |
| CAPACITOR 6 | 6.6 nF | 20.9 mohms | 65.17 pH |
| CAPACITOR 9 | 15.3 nF | 100 mohms | 218.2 pH |
| CAPACITOR 8 | 13.26 nF | 15.4 mohms | 115 pH |
| CAPACITOR 7 | 13.2 nF | 17.3 mohms | 79.39 pH |

The data showed that the capacitor type and the number of vias and their location greatly affects the resistance and inductance of the capacitor.

The impedance vs frequency response for two Type C capacitors with and without via connections were measured. For capacitor 3, listed above, the results showed an impedance of about 30 milliohms for the conditions both with and without vias and a resonance frequency shift due to the via connections from about 900 MHz for the capacitor without vias to about 500 MHz with vias. For capacitor 6 without vias the results showed an impedance of about 10 milliohms at a resonant frequency of about 350 MHz and for the condition with vias an impedance of about 20 milliohms at a resonant frequency of about 200 MHz Good correlation between the measured frequency response and the modelled response for the two capacitor types of different sizes was observed.

Simulation of the planar capacitor impedance vs frequency response for the planar capacitor with and without the contribution of the through-hole inductance was performed. The area of the through-hole interconnections was about 1% of the total area. The frequency response of one planar capacitor without the through-hole inductance had an impedance of about 80 milliohms at a resonant frequency of about 300 MHz while the frequency response with two planar capacitors with the through-hole inductances had an impedance of about 30 milliohms at a resonant frequency of about 250 MHz.

Based on the measured results and modelling results of the various individual capacitors, modeling and simulation for an array of 64 discrete embedded capacitors applying a conservative design rule of a minimum spacing between capacitors of 500 μm was performed. Capacitors of different sizes and different resonance frequencies were selected so that the capacitor array impedance response yielded fairly uniform, low impedance values. The impedance achieved in the 100 MHz to 1 GHz range was less than about 40 mΩ.

Based on measured and modeled results applying more demanding spacing design rules for an array of 1.15 to 2.5 mm per side sized capacitors an impedance of 0.7 mΩ was achieved in the 100 MHz to 1 GHz frequency range.

A simulation model for 100 uncoupled transmission lines routed on a 38 micron thick substrate with a relative dielectric constant of 3.8 separated from a power plane was designed. The transmission lines were spaced 10 mils apart, were 15 mm long, 2.82 mils in width and each line was terminated with 99 ohm resistors to the power and to the ground plane (a 50 ohm line termination). In one case the power plane was on a 14-micron thick substrate opposite a ground plane. The substrate having a relative dielectric constant of 3.8 and a Loss Tangent of 0.02. In another case the power plane was on a 14-micron thick substrate opposite the ground plane with a relative dielectric constant of 11 and a Loss Tangent of 0.02.

Output drivers producing a 5 GHz square wave bit stream with 80pS pulse width with 20 pS rise and fall times were used to drive all 100 transmission lines and the "eye" pattern response of a centrally located transmission line was obtained. The eye pattern for the first case, a power plane substrate with a dielectric constant of 3.8, the resulting eye opening height was 2.4799 Volts. In the response for the second case with the same conditions and a power plane substrate with a dielectric constant of 11 the eye opening height was 2.6929 Volts, a significant improvement over the first case. The spacing between the transmission lines was changed to 3 mils resulting in 50 coupled line pairs. With all other conditions remaining the same the eye pattern response was obtained. The eye pattern for this first coupled line case, a power plane substrate with a dielectric constant of 3.8, resulted in an eye opening height of 2.5297 Volts. The response for the second coupled line case with the same conditions and a power plane substrate with a dielectric constant of 11 the eye opening height was 2.6813 Volts, an improvement over the first case. The higher dielectric constant power plane substrate again resulted in an improved eye pattern response.

A simulation model for a configuration that included discrete decoupling capacitors in addition to the planar power plane substrates for the analysis of simultaneous switching noise (SSN) was constructed. This simulation model had 50 coupled transmission line pairs on a 38-micron thick substrate with a relative dielectric constant of 3.8 separated from a power plane. The transmission lines were spaced 3 mils apart, were 15 mm long, 2.82 mils in width and each line was terminated with 99 ohm resistors to the power and ground planes (a 50 ohm line termination). In some cases the power plane was on a 14-micron thick substrate opposite a ground plane. The substrate had a relative dielectric constant of 3.8 and a Loss Tangent of 0.02. In other cases the power plane was on a 14-micron thick substrate opposite the ground plane with a relative dielectric constant of 11 and a Loss Tangent of 0.02. Output drivers producing a 5 GHz square wave bit stream with 80 pS pulse width with 20 pS rise and fall times were used to drive all 100 transmission lines simultaneously and the noise voltage produced on the power plane was obtained. Variations in the type, SMT or embedded discrete, and quantity of capacitors were analyzed. The capacitors were located in an area at the driver or near end of the transmission lines.

In one case a configuration having 50 pairs of coupled lines (100 lines total), twenty-five SMT capacitors were placed at the driver end of the transmission line at every other line pair starting at line pair 1, the next at line pair 3 and ending at line pair 50. The planar power plane substrate had a dielectric constant of 3.8. Each SMT capacitor had a capacitance of 100 nF, an equivalent series inductance (ESL) of about 205 pH and an equivalent series resistance (ESR) of 100 milliohms. A 5 GHz square wave bit stream with 80 pS pulse width with 20 pS rise and fall times was used to drive all 100 transmission lines simultaneously and the noise voltage on the power plane was measured. This was duplicated for embedded discrete capacitors where each capacitor had a capacitance of 1 nF, an equivalent series inductance (ESL) of about 33 pH and an equivalent series resistance (ESR) of 9 milliohms. The planar power plane substrate in this configuration had a dielectric constant of 11. The voltage variation on the power plane for the 25 SMT capacitors with a planar power plane substrate dielectric constant of 3.8 had peak to peak voltage variation of about −0.1 Volts to +0.15 Volts while the voltage variation on the power plane for the 25 embedded discrete capacitors with a planar power plane substrate dielectric constant of 11 had a peak-to-peak voltage variation on the power plane of about −0.5 Volts to +0.05 Volts. A significant reduction in power plane noise produced by the simultaneous switching of output drivers resulted from the use of embedded capacitors and a higher dielectric constant planar power plane substrate.

Additional SMT capacitors were added to the SMT model to determine the number of SMT capacitors that would provide the equivalent noise reduction of the embedded capacitor configuration. Fifty, seventy-five and one hundred SMT capacitors were modeled. The fifty SMT capacitor configuration was achieved by placing capacitors at the driver end of every line pair. The seventy-five capacitor configuration was achieved by adding a second group of capacitors each located at the driver end of every other line pair and the one hundred capacitor configuration was achieved by adding SMT capacitors to produce a two by fifty array of capacitors at the driver end of the first pair thru $50^{th}$ pair of transmission lines.

The voltage variation on the power plane for fifty SMT capacitors and a planar substrate dielectric constant of 3.8 had a peak-to-peak voltage variation on the power plane of about −0.12 Volts to +0.12 Volts. The voltage variation on the power plane for seventy-five SMT capacitors and a planar substrate dielectric constant of 3.8 had a peak-to-peak voltage variation on the power plane of about −0.1 Volts to +0.1 Volts. The voltage variation on the power plane for one hundred SMT capacitors and a planar substrate dielectric constant of 3.8 had a peak-to-peak voltage variation on the power plane of about −0.075 Volts to +0.1 Volts. All four of the SMT capacitor configurations resulted in higher power plane noise, or voltage variation, as a result of simultaneous switching of output drivers than the embedded discrete capacitor configuration with twenty-five capacitors and a power plane dielectric constant of 11.

What is claimed is:

1. A device comprising a power core wherein said power core comprises:
    at least one embedded singulated capacitor layer containing more than one embedded singulated individual capacitor, each of said embedded singulated individual capacitors comprising a capacitor formed on a metal foil having a thickness of from 1 to 100 microns; and
    at least one planar capacitor laminate;
    wherein said planar capacitor laminate serves as a low inductance path to supply a charge to said embedded singulated individual capacitors; and
    wherein more than one of said embedded singulated individual capacitors in said embedded singulated capacitor layer are connected in parallel to one of the said at least one planar capacitor laminates; and
    wherein said power core is interconnected to at least one signal layer.

2. The device of claim 1 wherein said power core comprises multiple embedded singulated capacitor layers and multiple planar capacitor laminates.

3. The device of claim 1 wherein said embedded singulated individual capacitors each comprise at least a first electrode and a second electrode.

4. The device of claim 3 wherein the first electrode and second electrode of the embedded singulated individual capacitors are connected to at least one power terminal of a semiconductor device.

5. The device of claim 4 wherein said semiconductor device is an integrated circuit.

6. The device of claim 4 wherein each of the embedded singulated individual capacitors are placed closer to a power terminal of the semiconductor device than the planar capacitor to which the respective singulated individual capacitor is connected in parallel.

7. The device of claim 1 comprising more than one signal layer wherein said signal layers are connected through conductive vias.

8. The device of claim 1 wherein said device is selected from an interposer, printed wiring board, multichip module, area array package, system-on-package, and system-in-package.

9. The device of claim 1 wherein each of said embedded singulated individual formed on foil capacitors comprises a fired on foil capacitor.

10. The device of claim 1 wherein each of said embedded singulated individual capacitors comprising a capacitor formed on a metal foil having a thickness of from 3 to 75 microns.

11. The device of claim 1 wherein said at least one planar capacitor layer comprises an organic dielectric.

12. The device of claim 1 wherein the organic dielectric of the planar capacitor layer comprises a ceramic-filled organic dielectric.

13. A device comprising a power core for a semiconductor device wherein said power core comprises:

at least one embedded singulated capacitor layer containing more than one embedded singulated individual capacitor, each of said more than one embedded singulated individual capacitors comprising a capacitor formed on a metal foil, said metal foil forming a first electrode of each of said more than one embedded singulated individual capacitors, and each of said more than one embedded singulated capacitors further comprising a second electrode, wherein said first electrode and second electrode of said more than one embedded singulated individual capacitors are connected to at least one power terminal of the semiconductor device;

at least one planar capacitor laminate;

wherein said more than one of said embedded singulated individual capacitors in said embedded singulated capacitor layer are each connected in parallel to one of the said at least one planar capacitor laminate and said planar capacitor laminate serves as a low inductance path to supply a charge to said more than one embedded singulated individual capacitors;

wherein each of said more than one embedded singulated individual capacitors connected in parallel to said planar capacitor are closer to a power terminal of the semiconductor device than is the planar capacitor to which the respective singulated individual capacitor is connected in parallel; and wherein said power core is interconnected to at least one signal layer.

14. The device of claim 13 wherein said semiconductor device is an integrated circuit.

* * * * *

UNITED STATES PATENT AND TRADEMARK OFFICE
CERTIFICATE OF CORRECTION

PATENT NO. : 7,613,007 B2  Page 1 of 1
APPLICATION NO. : 11/289994
DATED : November 3, 2009
INVENTOR(S) : Amey, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 398 days.

Signed and Sealed this

Nineteenth Day of October, 2010

David J. Kappos
*Director of the United States Patent and Trademark Office*